(12) United States Patent
Park

(10) Patent No.: US 11,581,591 B2
(45) Date of Patent: Feb. 14, 2023

(54) BATTERY MODULE ASSEMBLY

(71) Applicant: HYUNDAI MOBIS Co., Ltd., Seoul (KR)

(72) Inventor: Ho Jin Park, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 266 days.

(21) Appl. No.: 16/937,929

(22) Filed: Jul. 24, 2020

(65) Prior Publication Data

US 2021/0028514 A1 Jan. 28, 2021

(30) Foreign Application Priority Data

Jul. 25, 2019 (KR) .................. 10-2019-0090453

(51) Int. Cl.
| | | |
|---|---|---|
| *H01M 10/48* | (2006.01) | |
| *G01R 31/3835* | (2019.01) | |
| *G01K 1/02* | (2021.01) | |
| *G01R 31/396* | (2019.01) | |
| *H01M 50/20* | (2021.01) | |
| *H01M 50/502* | (2021.01) | |

(52) U.S. Cl.
CPC .......... *H01M 10/482* (2013.01); *G01K 1/026* (2013.01); *G01R 31/3835* (2019.01); *G01R 31/396* (2019.01); *H01M 50/20* (2021.01); *H01M 50/502* (2021.01); *H01M 2220/20* (2013.01)

(58) Field of Classification Search
CPC ...... G01K 1/026; G01K 1/14; G01R 31/3835; G01R 31/396; H01M 10/0481; H01M 10/482; H01M 2220/20; H01M 50/20; H01M 50/211; H01M 50/233; H01M 50/264; H01M 50/284; H01M 50/298; H01M 50/502; H01M 50/505; H01M 50/519; H01M 50/54; Y02E 60/10; Y02P 70/50; Y02T 10/70
See application file for complete search history.

(56) References Cited

U.S. PATENT DOCUMENTS

2015/0236387 A1* 8/2015 Kasugai .............. H01M 10/625
429/120

FOREIGN PATENT DOCUMENTS

| CN | 104756307 A | 7/2015 |
|---|---|---|
| CN | 105304833 A | 2/2016 |
| KR | 10-0884944 B1 | 2/2009 |
| KR | 10-2018-0068158 A | 6/2018 |

* cited by examiner

*Primary Examiner* — Victoria H Lynch
(74) *Attorney, Agent, or Firm* — NSIP Law

(57) ABSTRACT

A battery module assembly includes a plurality of cells, a plurality of cartridges including a first cartridge (a cartridge A) and a second cartridge (a cartridge B) alternately stacked with a corresponding cell therebetween, and a caulking pipe inserted into a through hole provided in a corner of each of the stacked plurality of cartridges, for assembling the plurality of cartridges. A bus bar among main elements configuring a voltage sensing assembly is disposed in a frame configuring a short side among four frames configuring the first cartridge, and a sensing wire among the main elements configuring the voltage sensing assembly is disposed in two frames configuring a short side and one frame configuring a long side among four frames configuring the second cartridge.

18 Claims, 29 Drawing Sheets

170: 171, 172, 173, 174
180: 181, 182, 183, 184

407: 407A, 407B AND 407C

BATTERY MODULE ASSEMBLY

CROSS-REFERENCE TO RELATED APPLICATIONS

This application claims priority under 35 U.S.C. § 119 to Korean Patent Application No. 10-2019-0090453, filed on Jul. 25, 2019, the disclosure of which is incorporated herein by reference in its entirety.

TECHNICAL FIELD

The present invention relates to a battery module assembly applied to vehicles.

BACKGROUND

FIG. 1 is an exploded perspective view of a related art battery module assembly 100.

Referring to FIG. 1, the related art battery module assembly 100 includes a plurality of pouch type battery cells 200, a cell cover 310 which surrounds whole outer surfaces of a pair of battery cells (two battery cells) or three or more battery cells, and an upper frame member 400 and a lower frame member 500 which are vertically detached from each other and are coupled to each other in an assembly fastening structure.

In FIG. 1, reference numeral 223 refers to an electrode terminal, and reference numerals 600 and 601 refer to bus bars. Descriptions of the other reference numerals are omitted.

The related art battery module assembly 100 has the following problems.

First, a forming structure is processed to surround a pair of battery cells (two battery cells) or three or more battery cells, and in this case, a cell cover 310 may use a thin aluminum material so as to decreasing a size thereof. The aluminum material has a high possibility that insulating properties are damaged by water.

Second, although not shown in detail, an insert nut structure (an assembly structure) for assembling an upper detachable frame and a lower detachable frame and an insert bolt structure (a mounting structure) for mounting a battery module on an inner portion of a vehicle are needed, a battery module size increases and the number of elements increases.

Third, a lower frame member 500 is manufactured by an injection process, but a limitation of the injection process causes a phenomenon (a rib bending phenomenon) where a vertical partition wall part (rib) configuring the lower frame member 500 is inward contracted like a direction of a dotted arrow illustrated in FIG. 1.

Therefore, in order to easily insert the cell cover surrounding the battery cells into the lower frame member 500, a worker should perform a handwork of unfolding a partition wall part with hands several to tens times before working, and the handwork increases an assembly cycle time (an assembly process time).

SUMMARY

Accordingly, the present invention provides a battery module assembly and a method of manufacturing the same, which decrease a size of the battery module assembly and the number of elements and simultaneously reduce an assembly cycle time of the battery module assembly.

The object of the present invention is not limited to the aforesaid, but other objects not described herein will be clearly understood by those skilled in the art from descriptions below.

In one general aspect, a battery module assembly includes: a plurality of cells; a plurality of cartridges stacked in a vertical direction with a corresponding cell therebetween; and a caulking pipe inserted into a through hole provided in a corner of each of the stacked plurality of cartridges, for assembling the plurality of cartridges, wherein a bus bar and a sensing wire configuring a voltage sensing assembly are included in each of a first cartridge (a cartridge A) and a second cartridge (a cartridge B) among the plurality of cartridges assembled by the caulking pipe.

In another general aspect, a battery module assembly includes: a plurality of cells; a plurality of cartridges stacked in a vertical direction with a corresponding cell therebetween, the plurality of cartridges including a first cartridge (a cartridge A) including a bus bar configuring a voltage sensing assembly and a second cartridge (a cartridge B) including a sensing wire configuring the voltage sensing assembly; and a caulking pipe inserted into a through hole provided in a corner of each of the stacked plurality of cartridges, wherein the voltage sensing assembly includes: a voltage sensing lower housing 405 covering a rear surface of an assembly with the plurality of cartridges stacked therein; and a voltage sensing upper housing 409 covering the voltage sensing lower housing 405.

In another general aspect, a battery module assembly includes: a plurality of cells; a plurality of cartridges including a first cartridge (a cartridge A) and a second cartridge (a cartridge B) alternately stacked with a corresponding cell therebetween; and a caulking pipe inserted into a through hole provided in a corner of each of the stacked plurality of cartridges, for assembling the plurality of cartridges, wherein a bus bar among main elements configuring a voltage sensing assembly is disposed in a frame configuring a short side among four frames configuring the first cartridge, and a sensing wire among the main elements configuring the voltage sensing assembly is disposed in two frames configuring a short side and one frame configuring a long side among four frames configuring the second cartridge.

Other features and aspects will be apparent from the following detailed description, the drawings, and the claims.

DETAILED DESCRIPTION OF EMBODIMENTS

Figure 1:
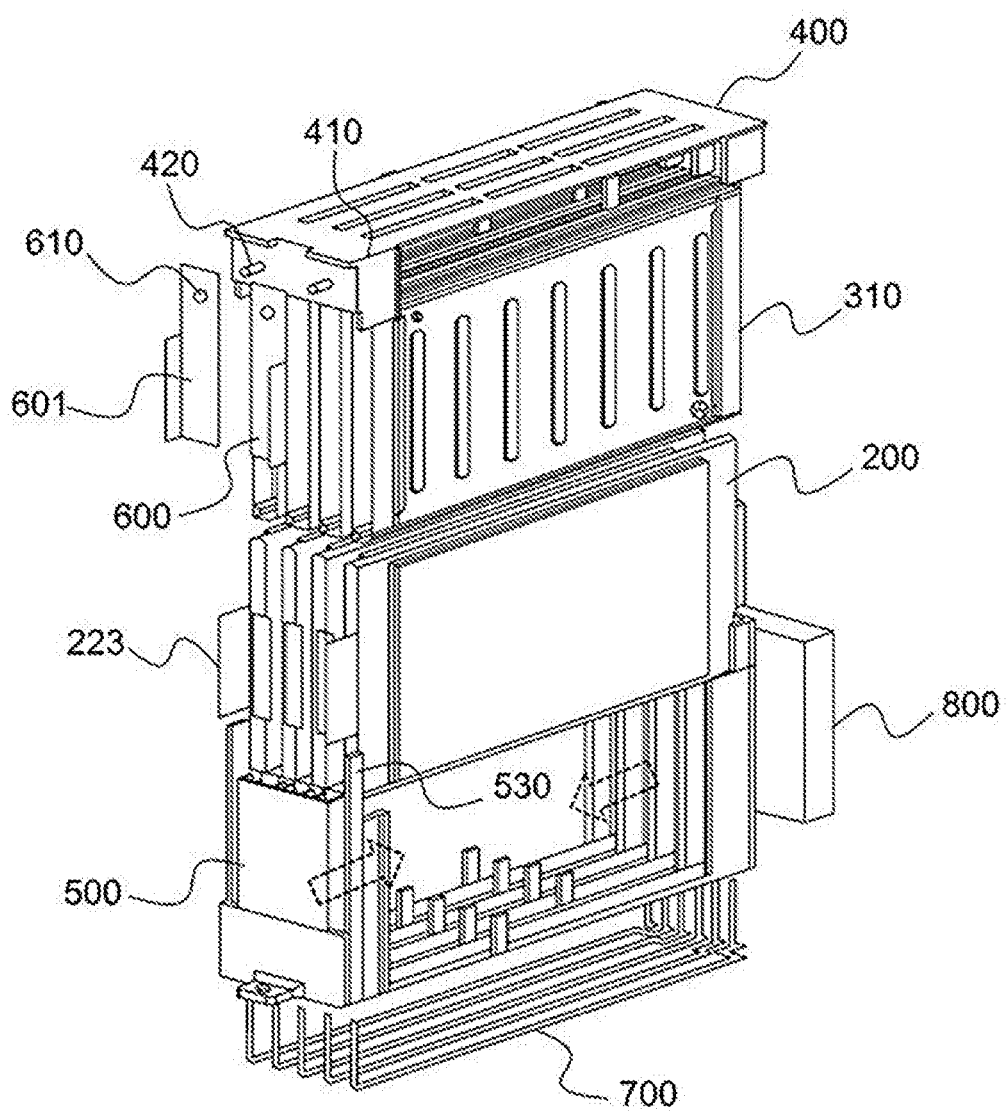
FIG. 1 is an exploded perspective view of a related art battery module assembly.

Hereinafter, example embodiments of the present invention will be described in detail with reference to the accompanying drawings. Embodiments of the present invention are provided so that this disclosure will be thorough and complete, and will fully convey the concept of the present invention to one of ordinary skill in the art. Since the present invention may have diverse modified embodiments, preferred embodiments are illustrated in the drawings and are described in the detailed description of the present invention. However, this does not limit the present invention within specific embodiments and it should be understood that the present invention covers all the modifications, equivalents, and replacements within the idea and technical scope of the present invention. Like reference numerals refer to like elements throughout.

Figure 2:
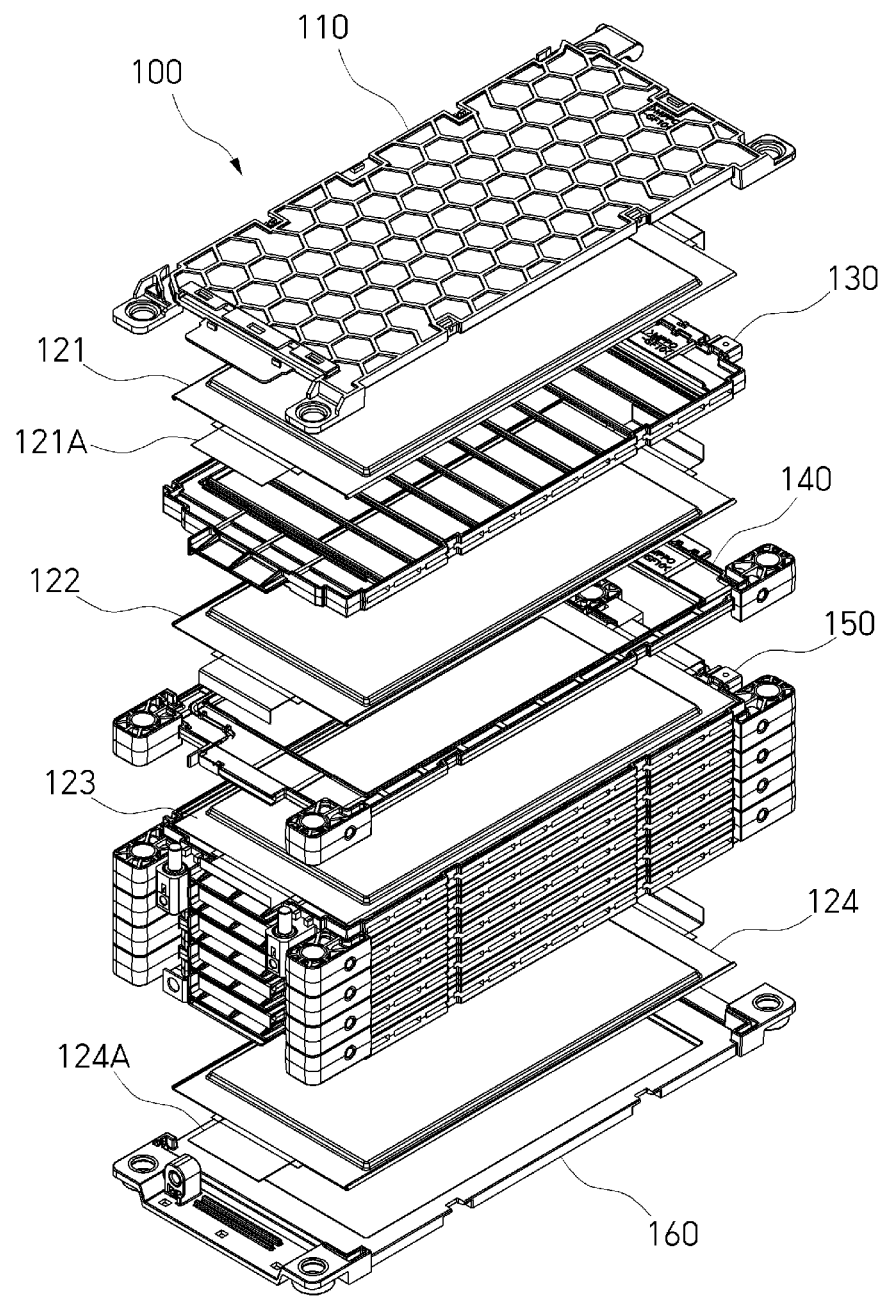
FIG. 2 is an exploded perspective view of a battery module assembly according to an embodiment of the present invention.
Figure 3:
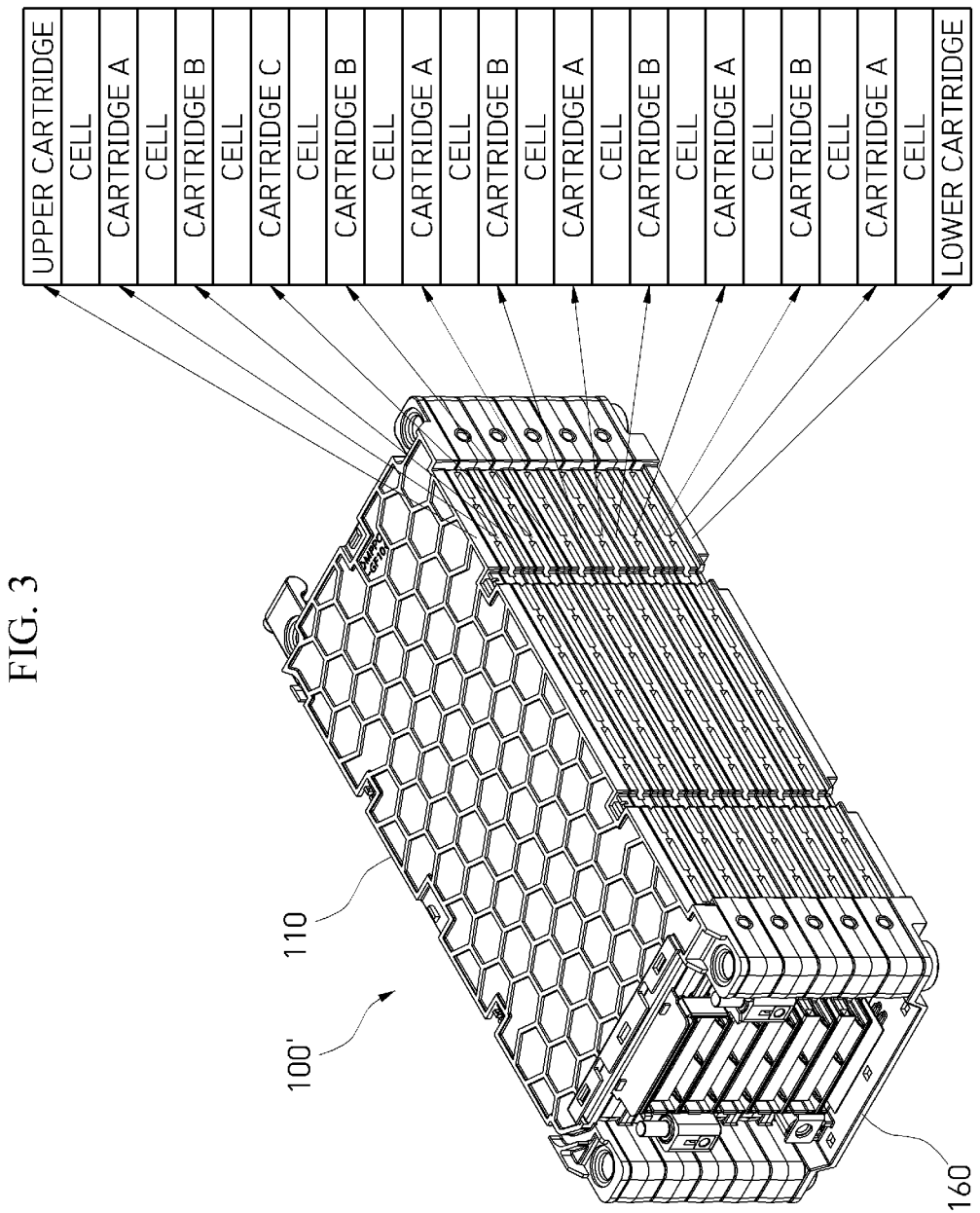
FIG. 3 is a perspective view illustrating a state where elements illustrated in FIG. 2 are assembled.
Figure 4:
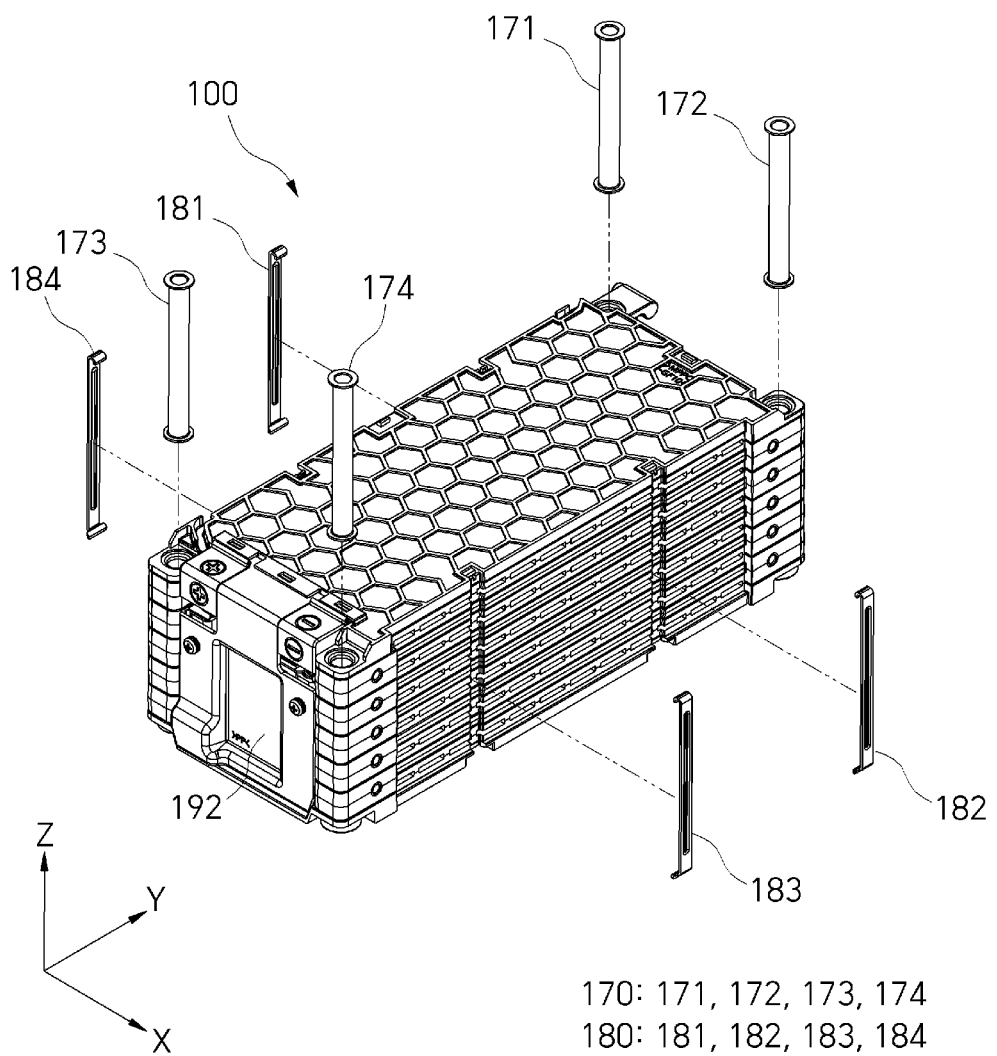
FIG. 4 is a perspective view illustrating elements for binding a plurality of stacked elements in a state where the elements illustrated in FIG. 2 are stacked.
Figure 5:
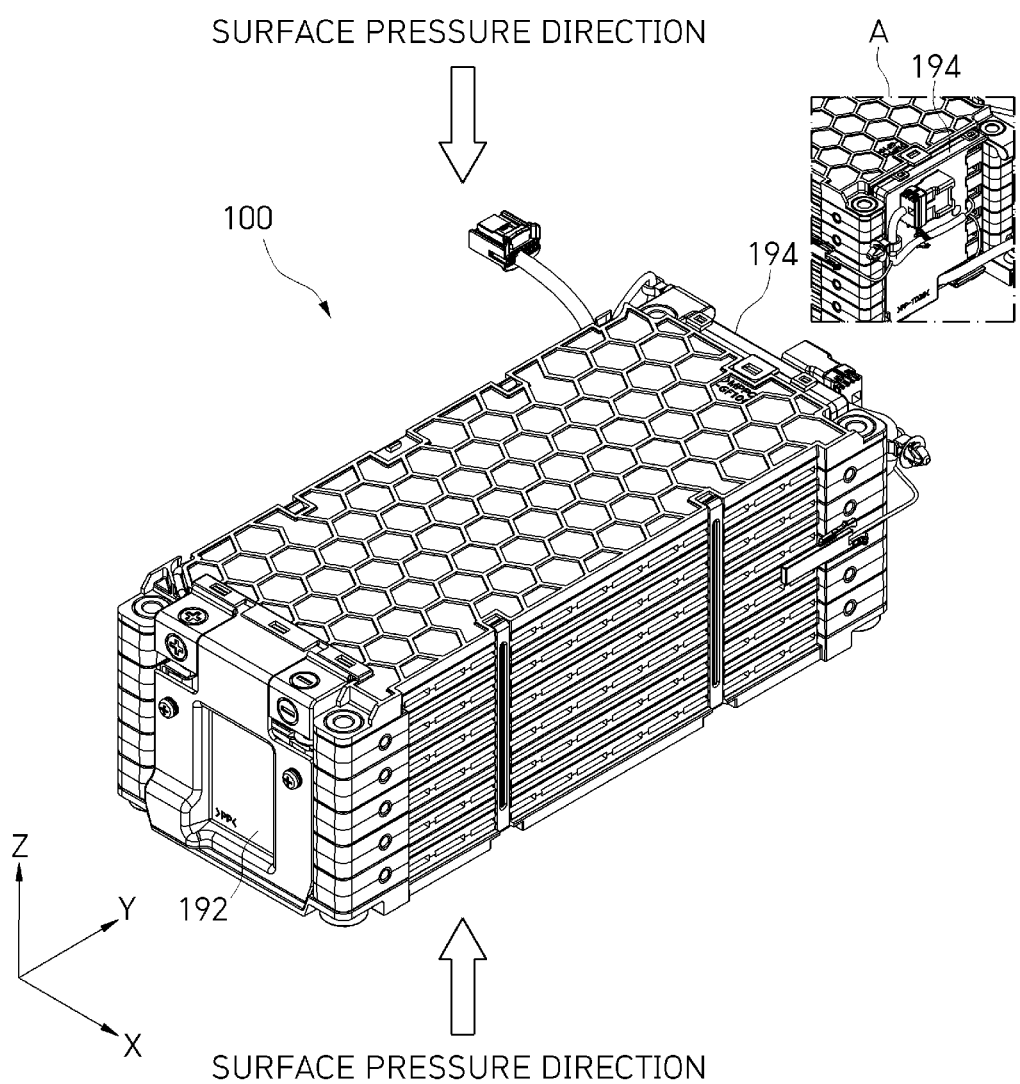
FIG. 5 is a perspective view illustrating a final appearance of a battery module assembly assembled by elements illustrated in FIG. 4.

FIG. 2 is an exploded perspective view of a battery module assembly according to an embodiment of the present invention. FIG. 3 is a perspective view illustrating a state where elements illustrated in FIG. 2 are assembled. FIG. 4 is a perspective view illustrating elements for binding a plurality of stacked elements in a state where the elements illustrated in FIG. 2 are stacked. FIG. 5 is a perspective view illustrating a final appearance of a battery module assembly assembled by elements illustrated in FIG. 4.

Referring to FIGS. 2 to 5, a battery module assembly 100 according to an embodiment of the present invention may simultaneously provide an assembly structure and a mounting structure without external members such as upper and lower frame members 400 and 500 with a cell cover 310 inserted thereinto as in the related art, and thus, may decrease a total size, the number of elements, and an assembly cycle time.

To this end, the battery module assembly 100 according to an embodiment of the present invention may include a plurality of cartridges 110, 130, 140, 150, and 160 and a plurality of cells 121 to 124.

One cell may be disposed between the plurality of cartridges 110, 130, 140, 150, and 160, and thus, the battery module assembly 100 may have a structure where the plurality of cartridges 110, 130, 140, 150, and 160 and the plurality of cells 121 to 124 are sequentially stacked.

The plurality of cartridges 110, 130, 140, 150, and 160 may include an upper cartridge 110, a lower cartridge 160, and a plurality of middle cartridges 130 to 150 stacked therebetween, which are stacked with each cell therebetween.

The plurality of middle cartridges 130 to 150 may include a plurality of cartridge A 130, a plurality of cartridge B 140, and one cartridge C 150.

Although not limited, in the present embodiment, the cartridge A and the cartridge B may be stacked between the cartridge C 150 and the upper cartridge 110, and the cartridge A and the cartridge B may be stacked between the cartridge C 150 and the lower cartridge 160.

In the battery module assembly 100 according to an embodiment of the present invention, each of the upper cartridge 110, the lower cartridge 160, and the cartridge C 150 may be provided as one, and each of the cartridge A 130 and the cartridge B 140 may be provided as five.

Additionally, as illustrated in FIG. 3, the battery module assembly 100 according to an embodiment of the present invention may further include a plurality of caulking members 170 (for example, 171 to 174) and a plurality of coupling members 180 (for example, 181 to 184), which bind a structure (100' of FIG. 3) where the plurality of cartridges 110, 130, 140, 150, and 160 and the plurality of cells 121 to 124 are stacked.

The caulking pipe 170 may bind (fix or couple) a corner of the structure (100' of FIG. 3) where the plurality of cartridges 110, 130, 140, 150, and 160 and the plurality of cells 121 to 124 are stacked. The coupling member 180 may bind (fix or couple) a side surface of the structure 100' where the plurality of cartridges 110, 130, 140, 150, and 160 and the plurality of cells 121 to 124 are stacked.

The structure (100' of FIG. 3) where the plurality of cartridges 110, 130, 140, 150, and 160 and the plurality of cells 121 to 124 are stacked may be bound (fixed or coupled) by the caulking pipe 170 and the coupling member 180, and thus, may be configured with the battery module assembly 100 of a unit module.

Both ends of each of the caulking pipes 171 to 174 may be processed in a T-shaped caulking structure, and thus, the caulking pipes 171 to 174 may bind (fix or couple) the battery module assembly 100 horizontally and vertically (in X, Y, and Z directions) at corners of the battery module assembly 100.

The coupling members 181 to 184 may each include both ends which are processed in a hook shape to be locked at both side surfaces of the battery module assembly 100, and the both ends may be respectively locked at a locking structure (for example, an upper hanging groove (81 of FIG. 8) and a lower hanging groove (83 of FIG. 8)) provided in a long side of the upper cartridge 110 and a long side of the lower cartridge 160.

Therefore, the coupling members 181 to 184 may bind (fix or couple) in a vertical direction (the Z direction) the cartridges 110, 130, 140, 150, and 160 and the cells 121 to 124 stacked on both side surfaces of the battery module assembly 100.

In FIGS. 4 and 5, reference numeral 192 refers to a front cover which covers a front surface of the battery module assembly 100.

In FIG. 5, reference numeral 194 refers to a rear cover which covers a rear surface of the battery module assembly 100, and 'A' illustrated at a right upper portion of FIG. 5 shows a state where the rear cover 194 is mounted on a rear surface of the battery module assembly 100.

In FIG. 3, a structure 100' where a plurality of cartridges and a plurality of cells are stacked is illustrated. FIG. 3 illustrates an example where the cartridges of the structure 100' are stacked in the order of an upper cartridge, a cartridge A, a cartridge B, a cartridge C, a cartridge B, a cartridge A, a cartridge B, a cartridge A, a cartridge B, a cartridge A, a cartridge B, a cartridge A, and a lower cartridge and each of the plurality of cells are stacked between two adjacent cartridges of the plurality of cartridges.

Hereinafter, the elements of the battery module assembly 100 according to an embodiment of the present invention will be described in detail.

Caulking Pipe 170

Figure 6:
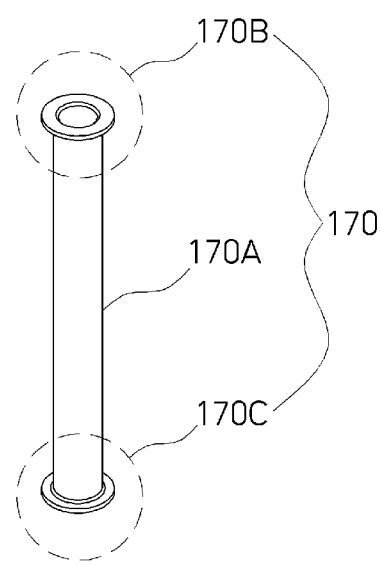
FIG. 6 is an enlarged view of a caulking pipe illustrated in FIG. 4.

FIG. 6 is an enlarged view of the caulking pipe illustrated in FIG. 4.

Referring to FIG. 6, the caulking pipe may be inserted into a through hole, provided in a corner of the battery module assembly 100 where the plurality of cartridges 110, 130, 140, 150, and 160 and the plurality of cells 121 to 124 are stacked, and may bind the corner of the battery module assembly 100.

In detail, the caulking pipe may include a cylindrical body 170A which extends by a height of the battery module assembly 100, and both end portions 170B and 170C of the body 170A may be configured to include a T-shaped caulking part (a caulking structure).

The cylindrical body 170A may be inserted into the through hole provided in the corner of the battery module assembly 100 and may bind the corner of the battery module assembly 100 in the X direction and the Y direction.

The both end portions of the cylindrical body 170A may be processed in the T-shaped caulking structure in a state where the cylindrical body 170A is inserted into the through hole provided in the corner of the battery module assembly 100, and thus, may bind the corner of the battery module assembly 100 in the Z direction.

Figure 7:
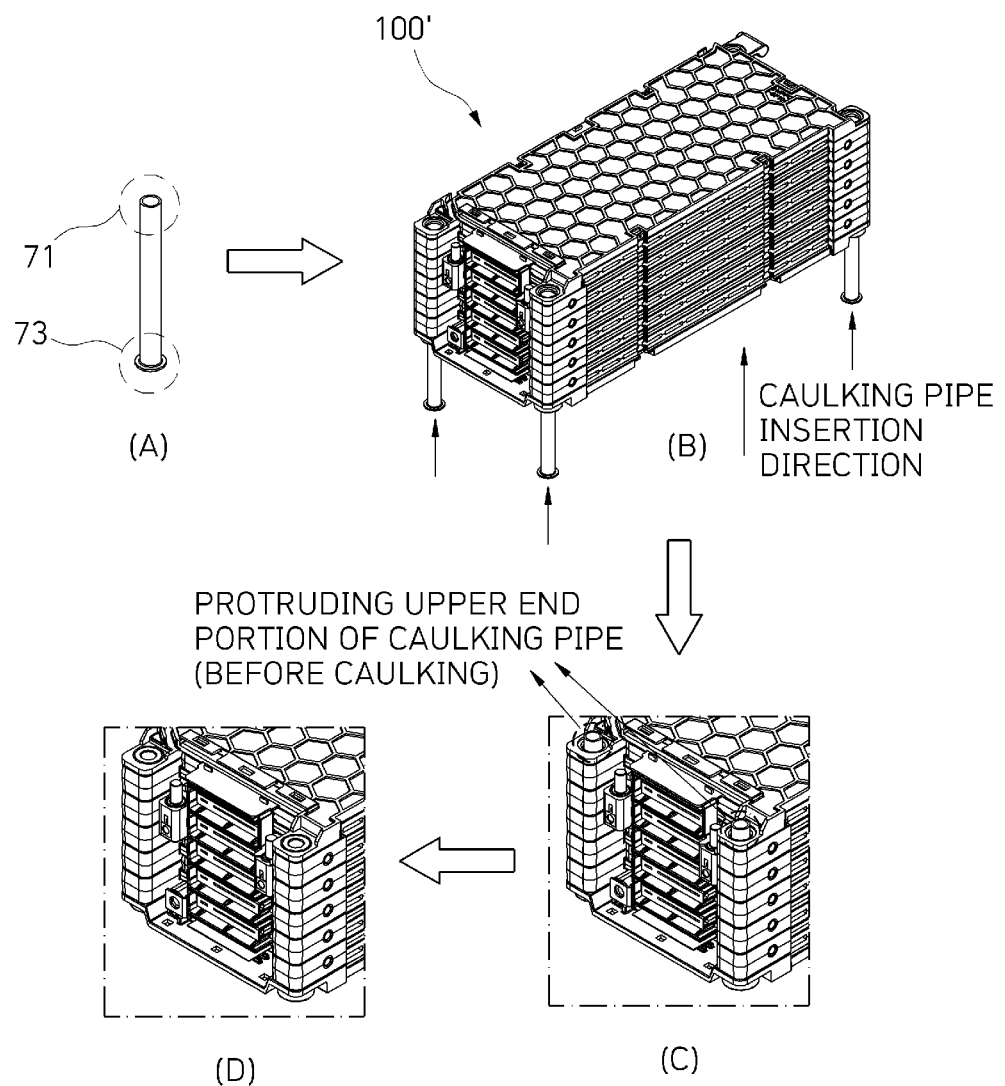
FIG. 7 is a diagram schematically illustrating an assembly process of a battery module assembly based on the caulking pipe illustrated in FIG. 6.

FIG. 7 is a diagram schematically illustrating an assembly process of the battery module assembly based on the caulking pipe illustrated in FIG. 6.

Referring to FIG. 7, first, as illustrated in FIG. 7 (A), a process of preparing a caulking pipe previously caulked in a T-shape at only one end portion of both end portions. Hereinafter, in step S110, a previously caulked end portion may be referred to as a lower end portion of the caulking pipe, and an end portion which is not caulked and has a pipe shape may be referred to as an upper end portion of the caulking pipe.

Subsequently, as illustrated in FIG. 7 (B), a caulking pipe where only a lower end portion 73 is caulked may be inserted into a through hole provided in a corner of the structure 100' where the plurality of cartridges 110, 130, 140, 150, and 160 and the plurality of cells 121 to 124 are stacked.

For example, only an upper end portion 71 which is not caulked may be first inserted into the through hole. At this time, the insertion may be performed in a direction from a lower portion of the structure 100' to an upper portion of the structure 100' and may be performed until the insertion is no longer performed by a caulking structure of the lower end portion 73.

Subsequently, as illustrated in FIG. 7 (C), when the caulking pipe is fully inserted, the upper end portion of the caulking pipe may protrude upward with respect to the through hole, and the upper end portion 71 of the protruding caulking pipe may be caulked by a pressing jig.

Subsequently, as illustrated in FIG. 7 (D), the corner of the structure 100' may be bound by the caulking pipe in the X, Y, and Z directions in a process of caulking the upper end portion 71 of the caulking pipe, and the battery module assembly may be primarily assembled.

Simultaneously, the caulking pipe may bind four corners of the caulking pipe in the Z direction (the vertical direction) as well as the X and Y directions, and thus, may maintain a surface pressure of the battery module assembly.

As the surface pressure is maintained, swelling of each cell may be prevented, and a reduction in cell durability may be minimized Coupling Member 180

Figure 8:
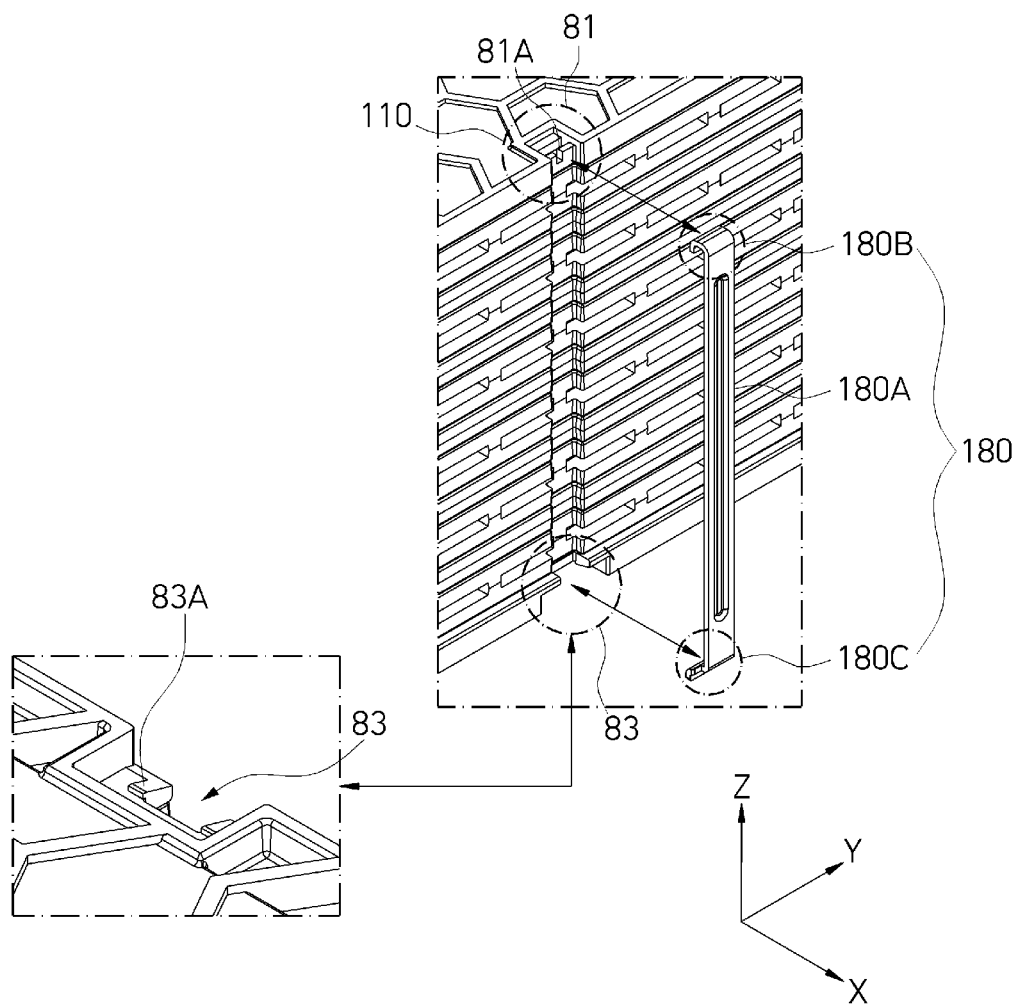
FIG. 8 is an enlarged view of a coupling member illustrated in FIG. 4.

FIG. 8 is an enlarged view of the coupling member illustrated in FIG. 4.

Referring to FIG. 8, the above-described caulking pipe 170 may primarily bind the battery module assembly, and then, may secondarily bind the battery module assembly by using the coupling member 180.

The coupling member 180 may vertically bind the battery module assembly at a side surface of the battery module assembly.

The coupling member 180 may include a body 180A which extends by a length corresponding to a height of the battery module assembly (or the structure 100'), a hook part 180B which is provided at one end portion (hereinafter referred to as an upper end portion) of the body 180A, and an elastic protrusion portion 180C which is provided at the other end portion (hereinafter referred to as a lower end portion) of the body 180A.

The hook part 180B may be provided in a hook shape and may be fastened to the upper hanging groove 81 provided at a long side of the upper cartridge 110 of the battery module assembly.

The elastic protrusion portion 180C may be detachably fastened to the lower hanging groove 83 provided at a long side of the lower cartridge 160 of the battery module assembly.

In a fastening method, first, the elastic protrusion portion 180C provided at a lower end portion of the body 180A may be pushed into the lower hanging groove 83 so as to be hung on a hanging jaw 83A of the lower hanging groove 83 of the lower cartridge 160 in a state where the hook part 180A provided at an upper end portion of the body 180A is provided on the upper hanging groove 81 of the upper cartridge 110, and thus, fastening may be made.

The coupling member 180 may vertically bind the battery module assembly at the side surface of the battery module assembly. The coupling member 180 may help maintain a surface pressure of the battery module assembly. A material of the coupling member 180 may be an elastic material, and for example, may be a plastic material. The coupling member 180 may be manufactured by an injection molding process.

Upper Cartridge 110 and Lower Cartridge 160

Figure 9:
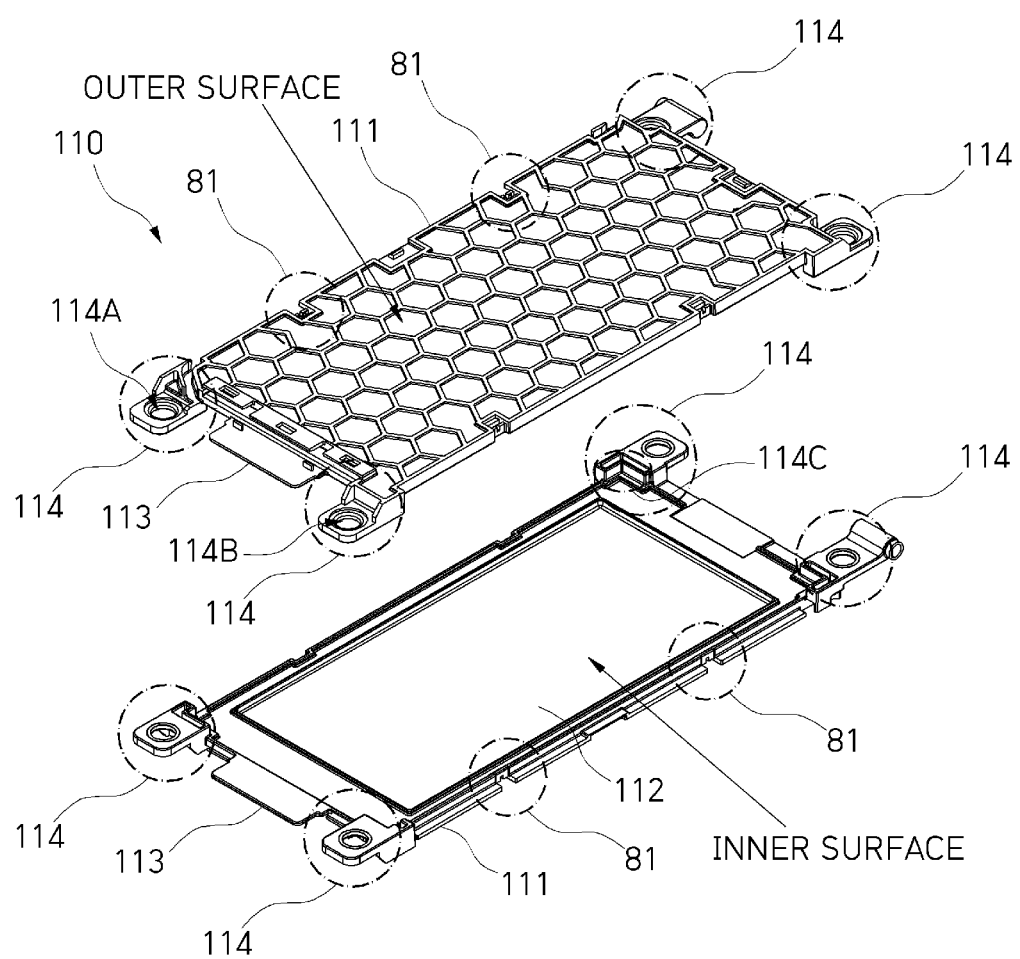
FIG. 9 is a perspective view illustrating an inner surface and an outer surface of an upper cartridge illustrated in FIG. 2.
Figure 10:
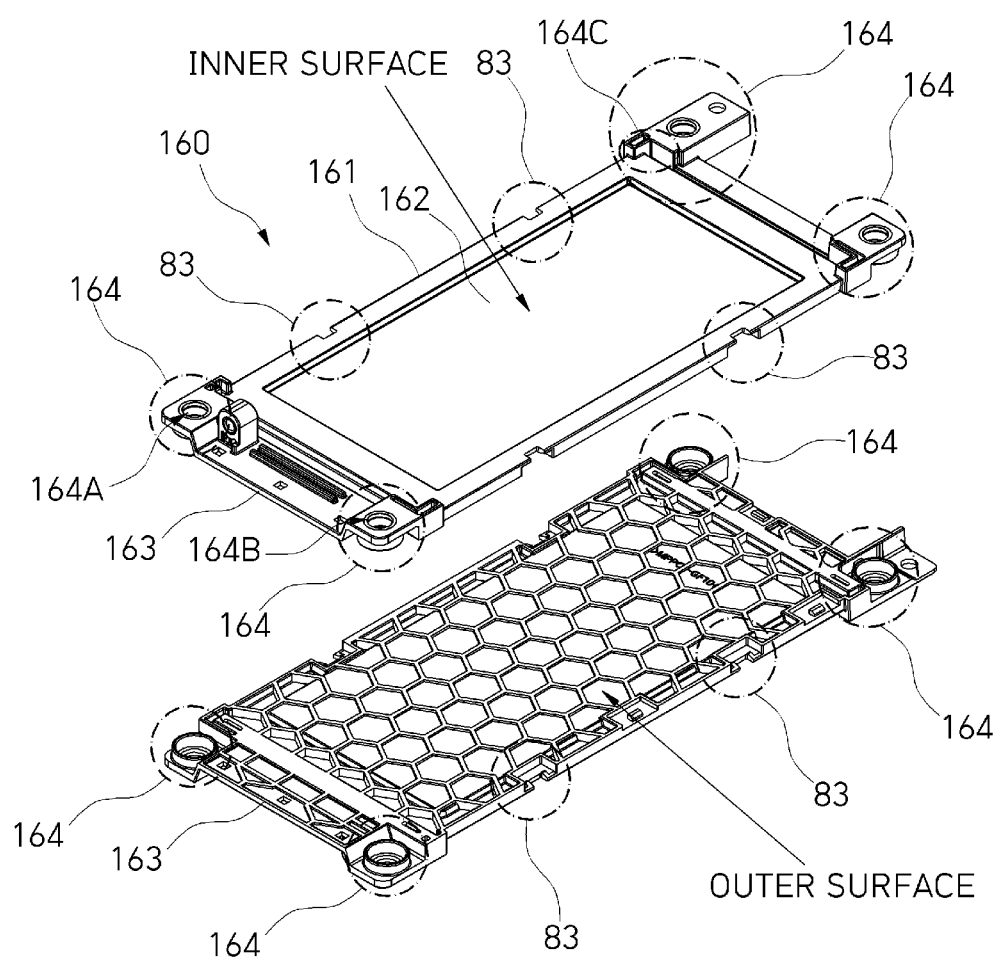
FIG. 10 is a perspective view illustrating an inner surface and an outer surface of a lower cartridge illustrated in FIG. 2.

FIG. 9 is a perspective view illustrating an inner surface and an outer surface (or an upper surface) of an upper cartridge illustrated in FIG. 2, and FIG. 10 is a perspective view illustrating an inner surface (or a lower surface) and an outer surface (or an upper surface) of a lower cartridge illustrated in FIG. 2.

An upper portion of FIG. 9 illustrates a shape of an outer surface of the upper cartridge 110, and a lower portion of FIG. 9 illustrates a shape of an inner surface of the upper cartridge 110.

First, referring to FIG. 9, the upper cartridge 110 may be an element which is stacked on an uppermost end of the battery module assembly, and for example, may be configured to include a rectangular plate 111 and a corner portion 114 provided at a corner of the plate 111.

In order to minimize the outermost deformation of the battery module assembly, an outer surface of the plate 111 may be patterned in a honeycomb shape as illustrated in FIG. 9A.

An accommodating space 112 for fixing a position of a cell (121 of FIG. 2) stacked on a lower portion of the upper cartridge 110 and accommodating the cell may be provided in an inner surface of the plate 111. The accommodating space 112 may be provided to have the same size as that of the cell (121 of FIG. 2), for fixing the position of the cell (121 of FIG. 2) and accommodating the cell.

In order to prevent the exposure of an electrode part (an outermost electrode part) (121A of FIG. 2) of the cell (121 of FIG. 2), a cover member 113 covering the electrode part (121A of FIG. 2) may be provided at a short side of the plate 111. The cover member 113 may be provided to have a size for sufficiently covering the electrode part (121A of FIG. 2).

The corner portion 114 may include a corner portion 114 including a hole (an upper hole) 114A with the above-described caulking pipe 170 inserted thereinto. A bushing member 114B may be provided on an inner circumference surface of the hole (the upper hole) 114A.

The bushing member 114B may be provided between the hole (the upper hole) 114A and the caulking pipe 170 and may absorb an impact occurring in a process of processing an upper end portion of the caulking pipe 170 to have a caulking structure by using the pressing jig, thereby preventing the deformation of the upper cartridge and the other cartridges.

A material of the bushing member 114B may include an arbitrary material for absorbing a physical impact, and a kind thereof is not limited.

An upper coupling groove 81 to which the hook part 180B provided at an upper end of the above-described coupling member 180 is fastened may be provided at a long side of the plate 111. The description of FIG. 8 may be applied to a description of the upper coupling groove 81.

An upper portion of FIG. 10 illustrates a shape of an inner surface of the lower cartridge 160, and a lower portion of FIG. 10 illustrates a shape of an outer surface of the lower cartridge 160.

Referring to FIG. 10, the lower cartridge 160 may be an element which is stacked on a lowermost end of the battery module assembly, and for example, may be configured to include a rectangular plate 161 and a corner portion 164 provided at a corner of the plate 161.

An accommodating space 162 for fixing a position of a cell (124 of FIG. 2) stacked on an upper portion of the lower cartridge 160 and accommodating the cell (124 of FIG. 2) may be provided in an inner surface of the plate 161. The accommodating space 162 may be provided to have the same size as that of the cell (124 of FIG. 2), for accommodating the cell.

In order to minimize the outermost deformation of the battery module assembly, an outer surface of the plate 161 may be patterned in a honeycomb shape.

In order to prevent the exposure of an electrode part (an outermost electrode part) (124A of FIG. 2) of the cell 124 stacked on the plate 161, a cover member 163 covering the electrode part (124A of FIG. 2) of the cell may be provided at a short side of the plate 161.

A lower coupling groove 83 to which an elastic protrusion portion (180C of FIG. 8) provided at a lower end of the above-described coupling member 180 is fastened may be provided at a long side of the plate 161. The description of FIG. 8 may be applied to a description of the lower coupling groove 83.

The corner portion 164 may be configured to include a hole (a lower hole) 164A with the above-described caulking pipe 170 inserted thereinto. A bushing member 164B may be provided on an inner circumference surface of the hole (the lower hole) 164A.

The bushing member 164B may be provided between the hole (the upper hole) 164A and the caulking pipe 170 and may absorb an impact occurring in a process of processing an upper end portion of the caulking pipe 170 to have a caulking structure by using the pressing jig, thereby preventing the deformation of the lower cartridge 160 and the other cartridges. A material of the bushing member 164B may include an arbitrary material for absorbing a physical impact, and a kind thereof is not limited.

Figure 11A:
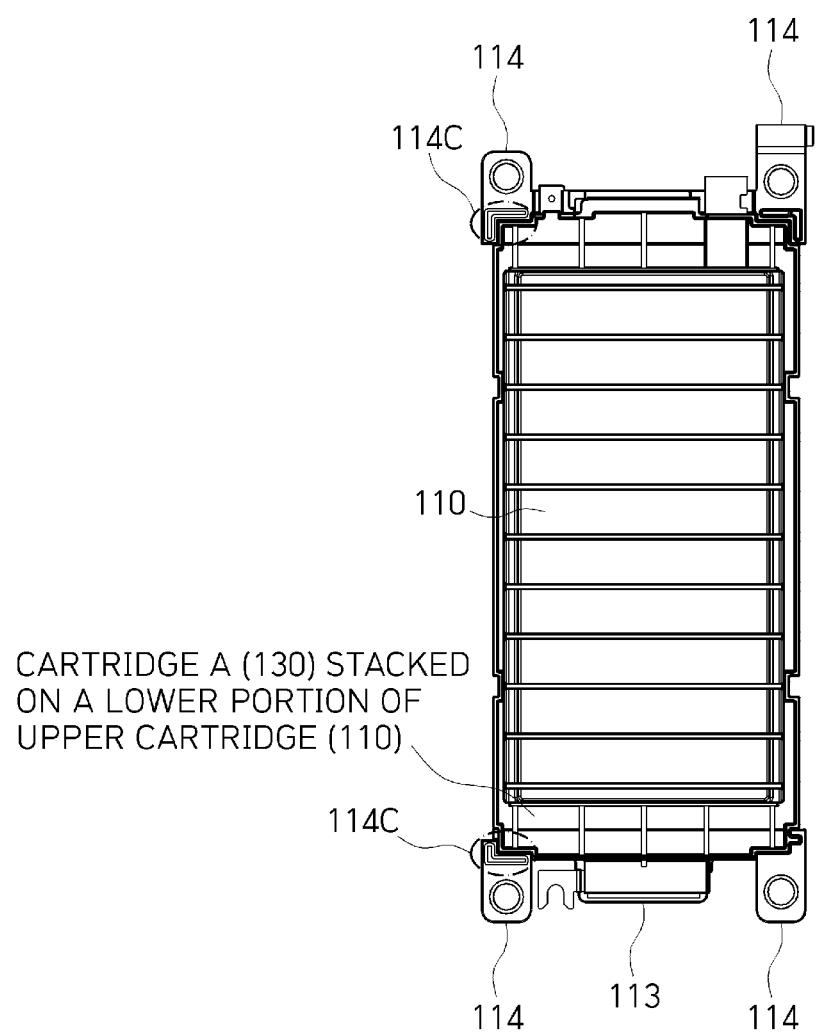
FIGS. 11A and 11B are a plan views illustrating a shape where a cartridge A is stacked on an upper/lower cartridge illustrated in FIGS. 9 and 10.
Figure 11B:
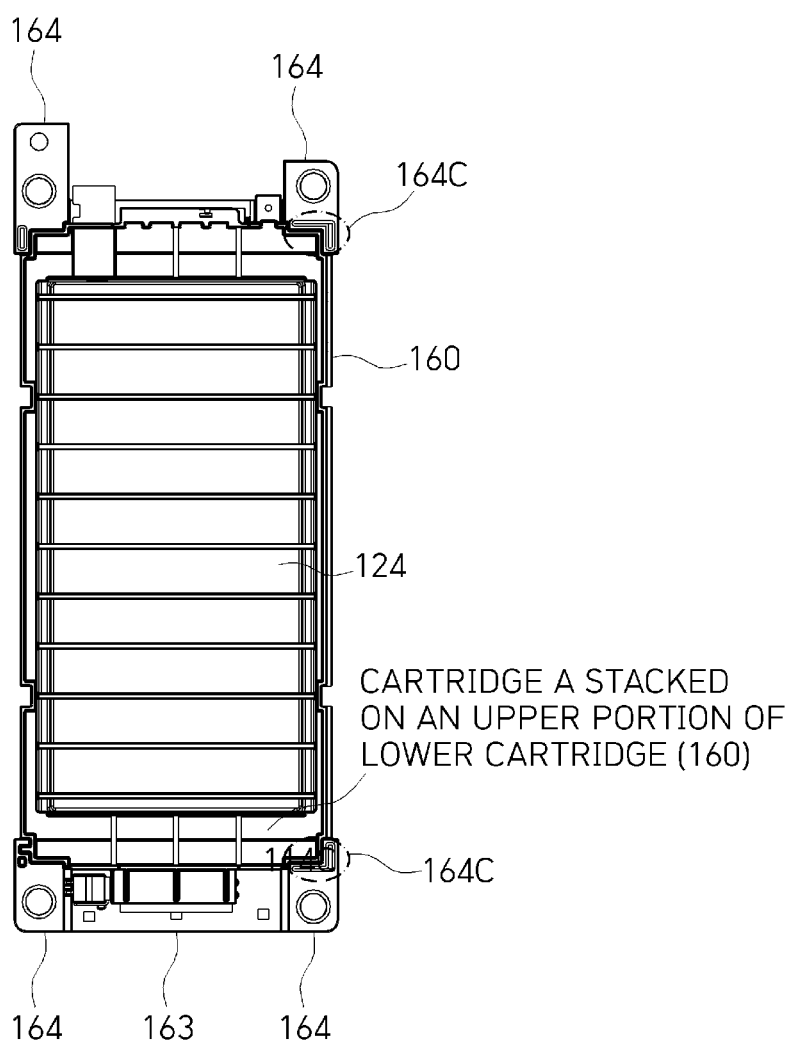

As illustrated in FIGS. 11A and 11B, each corner portion 114 of the upper cartridge 110 may be configured to include a ㄱ-shaped positioning jaw 114C for fixing a position of a cartridge A (130 of FIG. 2) stacked on a lower portion of each corner portion 114.

Similarly, each corner portion 164 of the lower cartridge 160 may be configured to include a ㄱ-shaped positioning jaw 164C for fixing a position of a cartridge A stacked on an upper portion of each corner portion 164.

Cartridge A 130

Figure 12:
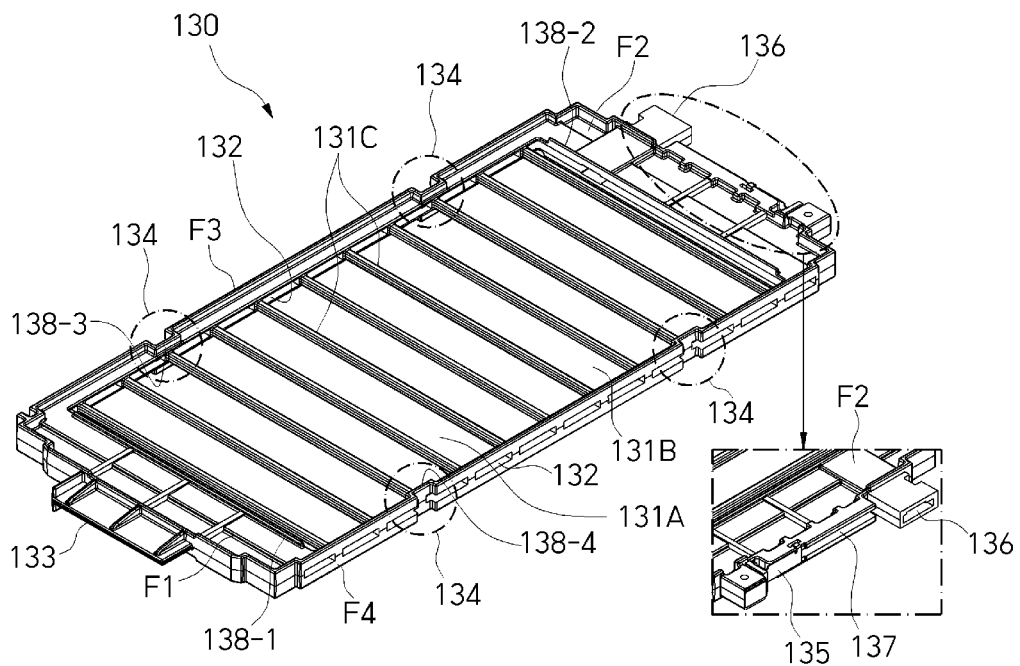
FIG. 12 is an enlarged view of a cartridge A illustrated in FIG. 2.

FIG. 12 is an enlarged view of a cartridge A illustrated in FIG. 2.

Referring to FIG. 12, a cartridge A 130 may have a rectangular shape and may include first to fourth frames F1 to F4.

The first and second frames F1 and F2 may configure a short side of the cartridge A 130, and the third and fourth frames F3 and F4 may configure a long side of the cartridge A 130. The cartridge A 130 may be manufactured by an injection molding process.

The cartridge A 130 may include a plurality of cooling channels 131A and 131B for cooling a cell. The plurality of cooling channels 131A and 131B may be provided in a direction from the third frame F3 to the fourth frame F4 or from the fourth frame F4 to the third frame F3.

In order to provide a cooling channel, the third and fourth frames F3 and F4 may include a plurality of air inflow ports 132 through which air flows in.

Each of the cooling channels may be a path which connect the air inflow ports 132 facing each other and may include a plurality of sidewalls 131C connecting an inner sidewall of the third frame F3 and an inner sidewall of the fourth frame F4, for forming the path. Based on a structure of each of the sidewalls 131C, the plurality of cooling channels 131A and 131B may be formed.

A positioning groove 134 where a body (180A of FIG. 8) of the above-described coupling member 160 is placed may be provided in each of both outer surfaces of the third frame F3 and the fourth frame F4.

A position at which the positioning groove 134 is provided may be a position corresponding to an upper hanging groove (81 of FIG. 8) of the upper cartridge 110 and a lower hanging groove (83 of FIG. 8) of the lower cartridge 160. That is, the positioning groove 134 may be disposed on a line which connects the upper hanging groove (81 of FIG. 8) of the upper cartridge 110 to the lower hanging groove (83 of FIG. 8) of the lower cartridge 160 in the vertical direction (the Z direction).

Moreover, a partition wall member 133 for preventing short circuit between electrode parts of vertically adjacent cells may be provided at one short side of the cartridge A 130, namely, the first frame F1.

Moreover, a bus bar 135 for sensing a voltage, a hole 136 with a temperature sensor inserted thereinto, and a shelter structure 137 for cell lead welding may be provided at the other short side of the cartridge A 130, namely, the second frame F2.

Moreover, a plurality of fixing members 138-1 to 138-4 may be provided on an inner surface of the cartridge A 130, for fixing a position of a cell. In detail, the plurality of fixing members 138-1 to 138-4 may include a plurality of first sidewalls 138_1 and 138_2, extending in parallel with a short side of the cartridge A 130 (i.e., the first and second frames F1 and F2), and a plurality of first sidewalls 138_3 and 138_4 formed by the positioning groove 134.

A position of a cell accommodated into (stacked on) the cartridge A 130 may be fixed by the fixing members 138-1 to 138-4.

Cartridge C 150

Figure 13:
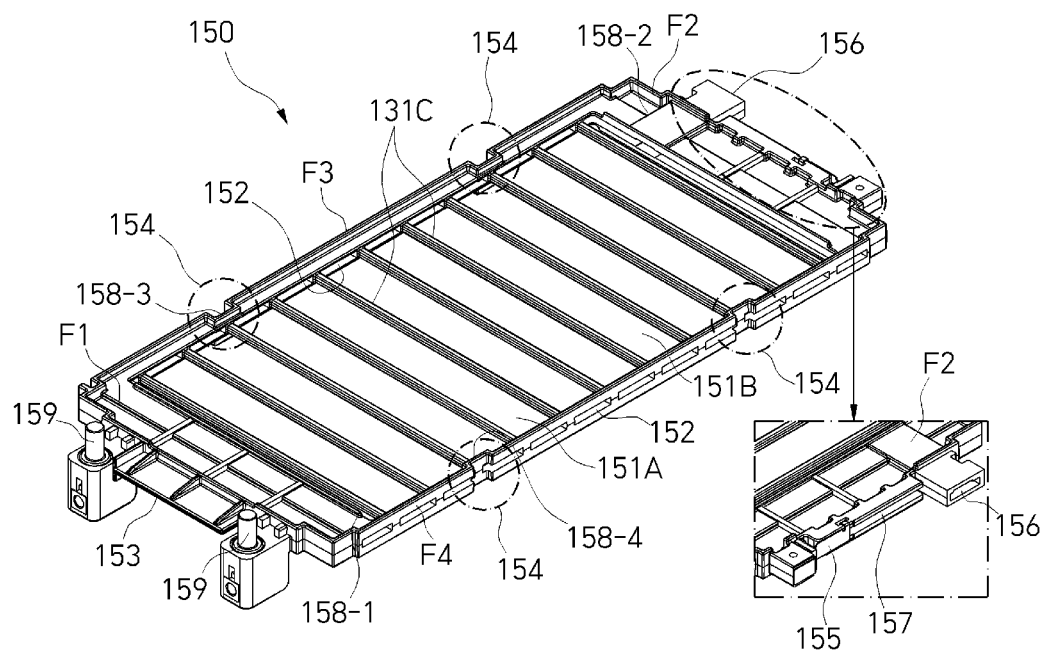
FIG. 13 is an enlarged view of a cartridge C illustrated in FIG. 2.

FIG. 13 is an enlarged view of a cartridge C illustrated in FIG. 2.

Referring to FIG. 13, except for that a cartridge C 150 includes positive (+) and negative (−) terminals 159, the cartridge C 150 may have a structure which is almost similar to the cartridge A 130.

The cartridge C 150 may have a rectangular shape and may include first to fourth frames F1 to F4. The first and second frames F1 and F2 may configure a short side of the cartridge C 150, and the third and fourth frames F3 and F4 may configure a long side of the cartridge C 150. The cartridge C 150 may be manufactured by an injection molding process.

The cartridge C 150 may include a plurality of cooling channels 151A and 151B for cooling a cell. In order to provide a cooling channel, a plurality of air inflow ports 132 through which air flows in may be provided in both side surfaces of the cartridge C 150 (i.e., the third and fourth frames F3 and F4).

Each of the cooling channels may be a path which connect the air inflow ports 132 facing each other and may include a plurality of sidewalls 151C connecting an inner sidewall of the third frame F3 and an inner sidewall of the fourth frame F4, for forming the path.

Based on a structure of each of the sidewalls 151C, the plurality of cooling channels 151A and 151B may be formed.

A positioning groove 154 where a body (180A of FIG. 8) of the above-described coupling member 160 is placed may be provided in each of both long sides of the cartridge C 150 (i.e., each of both outer surfaces of the third frame F3 and the fourth frame F4).

A position at which the positioning groove 154 is provided may be a position corresponding to an upper hanging groove (81 of FIG. 8) of the upper cartridge 110, a lower hanging groove (83 of FIG. 8) of the lower cartridge 160, and a positioning groove (134 of FIG. 12) of a cartridge A (130 of FIG. 12). That is, the positioning groove 154 may be disposed on a line which connects the upper hanging groove (81 of FIG. 8) of the upper cartridge 110, the lower hanging groove (83 of FIG. 8) of the lower cartridge 160, and the positioning groove 134 of the cartridge A 130 in the vertical direction (the Z direction).

Moreover, a partition wall member 153 for preventing short circuit between electrode parts of vertically adjacent cells may be provided at one short side of the cartridge C 150, namely, the first frame F1.

Moreover, a bus bar 155 for sensing a voltage, a hole 156 with a temperature sensor inserted thereinto, and a shelter structure 157 for cell lead welding may be provided at the other short side of the cartridge C 150, namely, the second frame F2.

Moreover, a plurality of fixing members may be provided on an inner surface of the cartridge C 150, for fixing a position of a cell. The plurality of fixing members may include a plurality of first sidewalls 158_1 and 158_2, extending in parallel with short sides F1 and F2 of the cartridge C 150, and a plurality of second sidewalls 158_3 and 158_4 formed by the positioning groove 154. A position of a cell accommodated into (stacked on) the cartridge C 150 may be fixed by the fixing members 158-1 to 158-4.

Moreover, as described above, unlike the cartridge A 130, the cartridge C 150 may include the positive (+) and negative (−) terminals 159, and the positive (+) and negative (−) terminals 159 may be provided at an outer sidewall of the first frame F1 in a direction vertical to a top surface of the first frame F1.

Cartridge B 140

Figure 14:
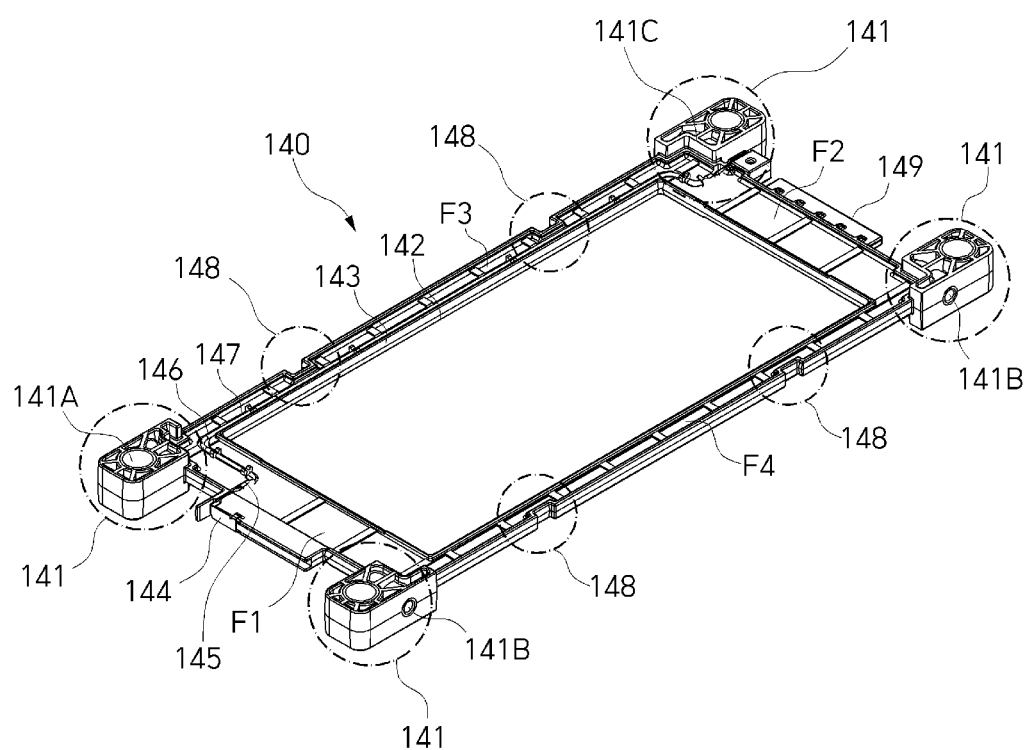
FIG. 14 is an enlarged view of a cartridge B illustrated in FIG. 2.

FIG. 14 is an enlarged view of a cartridge B illustrated in FIG. 2.

Referring to FIG. 14, when seen in a direction from an upper portion to a lower portion, the cartridge B 140 may be configured in a tetragonal ring shape where a center portion is empty.

A corner portion 141 including a hole (or a center hole) 141A may be provided at a corner portion of the cartridge B 140. As illustrated in FIG. 2, when a plurality of cartridges are stacked with one cell therebetween, the hole (or the center hole) 141A provided at the corner portion 141 of the cartridge B 140 may communicate with a hole (or a center hole) 114A provided at a corner portion (114 of FIG. 9) of the upper cartridge 110 and a hole 164A provided at a corner portion (164 of FIG. 10) of the lower cartridge 160, thereby forming a through hole with a caulking pipe (170 of FIG. 6) inserted thereinto.

A bushing member (not shown) may be provided on an inner circumference surface of the hole (the upper hole) 141A. The bushing member may be provided between the hole (the upper hole) 141A and the caulking pipe 170 and may absorb an impact occurring in a process of processing an upper end portion of the caulking pipe 170 to have a caulking structure by using the pressing jig or in a process of inserting the caulking pipe 170, thereby preventing the deformation of the cartridges.

Moreover, the cartridge B 140 may include four frames (for example, first to fourth frames) F1 to F4 connecting four corner portions 141. The first and second frames F1 and F2 may configure a short side of the cartridge B 140 and may configure long sides of the third and fourth frames F3 and F4.

A border of the cartridge A 130 and a border of the cartridge C 150 may be stacked on the four frames F1 to F4.

When the border of the cartridge A 130 and the border of the cartridge C 150 are stacked, the corner portion 141 may be configured to include a ⌐-shaped positioning jaw 141C, for fixing positions of the cartridge A 130 and the cartridge C 150.

Moreover, the cartridge B 140 may include a positioning part 142 for accommodating a cell (122 of FIG. 2) and a side surface portion 143. The positioning part 142 may be an element where at least a portion of a cell is placed and may be provided to correspond to a lower portion of the cell (122 of FIG. 2). For example, when a lower portion of cell (122 of FIG. 2) is provided to be flat, a top surface of the positioning part 142 may be provided to be flat.

The side surface portion 143 may be provided to stand in a direction vertical to a border of the positioning part 142. When the cell (122 of FIG. 2) is accommodated into the cartridge B 140, the side surface portion 143 may be disposed on a side surface of the cell to cover a side surface of the cell (122 of FIG. 2) and to fix a position of the cell (122 of FIG. 2).

Moreover, the cartridge B 140 may include a bus bar 144 for sensing a voltage. The bus bar 144 may be buried into a first buried groove 145 provided in a first frame F1 of the cartridge B 140. In this case, a portion of the bus bar 144 may be exposed at a portion on a side surface of the first frame F1, and the other portion may be buried into the first buried groove 145.

Moreover, the cartridge B 140 may include a sensing wire 146 for transferring a voltage sensing result based on the bus bar 144. The cartridge B 140 may include a second buried groove 147 where the sensing wire 146 is buried, for including the sensing wire 146.

The second buried groove 147 may be provided in the first to third frames F1 to F3. A portion of the second buried groove 147 may be provided in the first frame F1 and may communicate with the first buried groove 145. Based on the first and second buried grooves 145 and 147, the sensing wire 146 may be disposed along a portion of a border of the cartridge B 140.

Moreover, the cartridge B 140 may include a positioning groove 148 where a body (180A of FIG. 8) of the above-described coupling member 180 is placed.

The positioning groove 148 may be provided in an outer surface of each of the third and fourth frames F3 and F4 configuring a long side so that the coupling member 180 binds the battery module assembly at a side surface of the battery module assembly.

Moreover, the cartridge B 140 may include a partition wall 149, for preventing short circuit between an electrode part of a cell disposed at an upper portion of the cartridge B 140 and an electrode part of a cell disposed at a lower portion of the cartridge B 140.

The partition wall member 140 may extend from a side surface of the second frame F2 to have a size for covering an electrode part of a cell.

Figure 15:
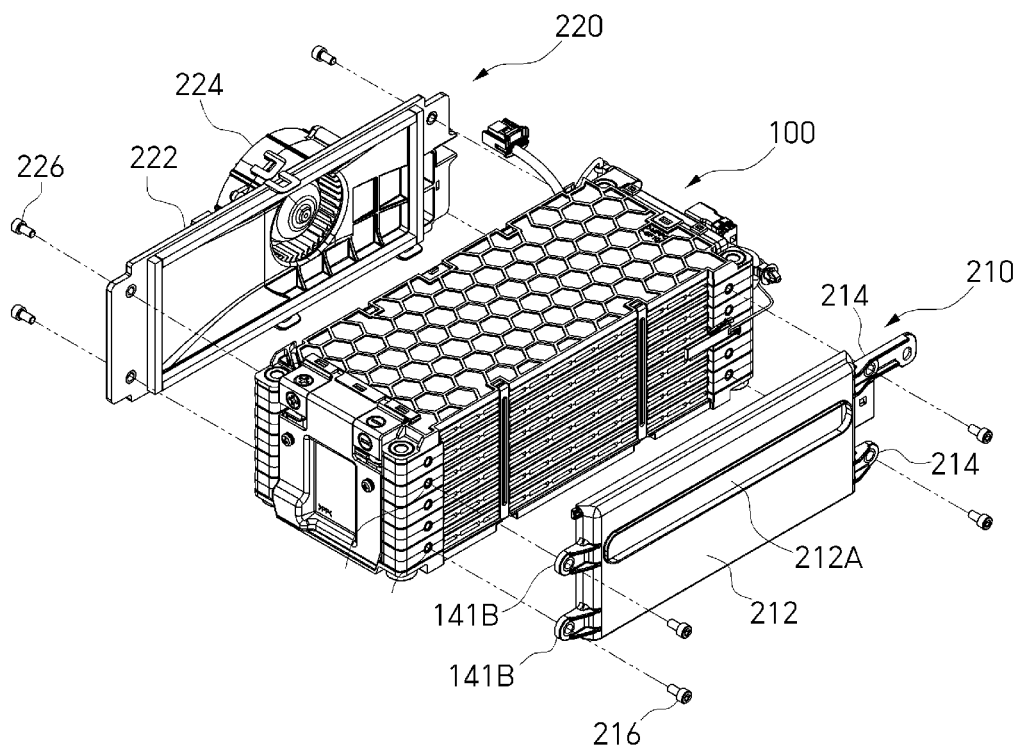
FIGS. 15 to 17 are diagrams for describing a structure where a battery module assembly according to an embodiment of the present invention is mounted on a case.
Figure 16:
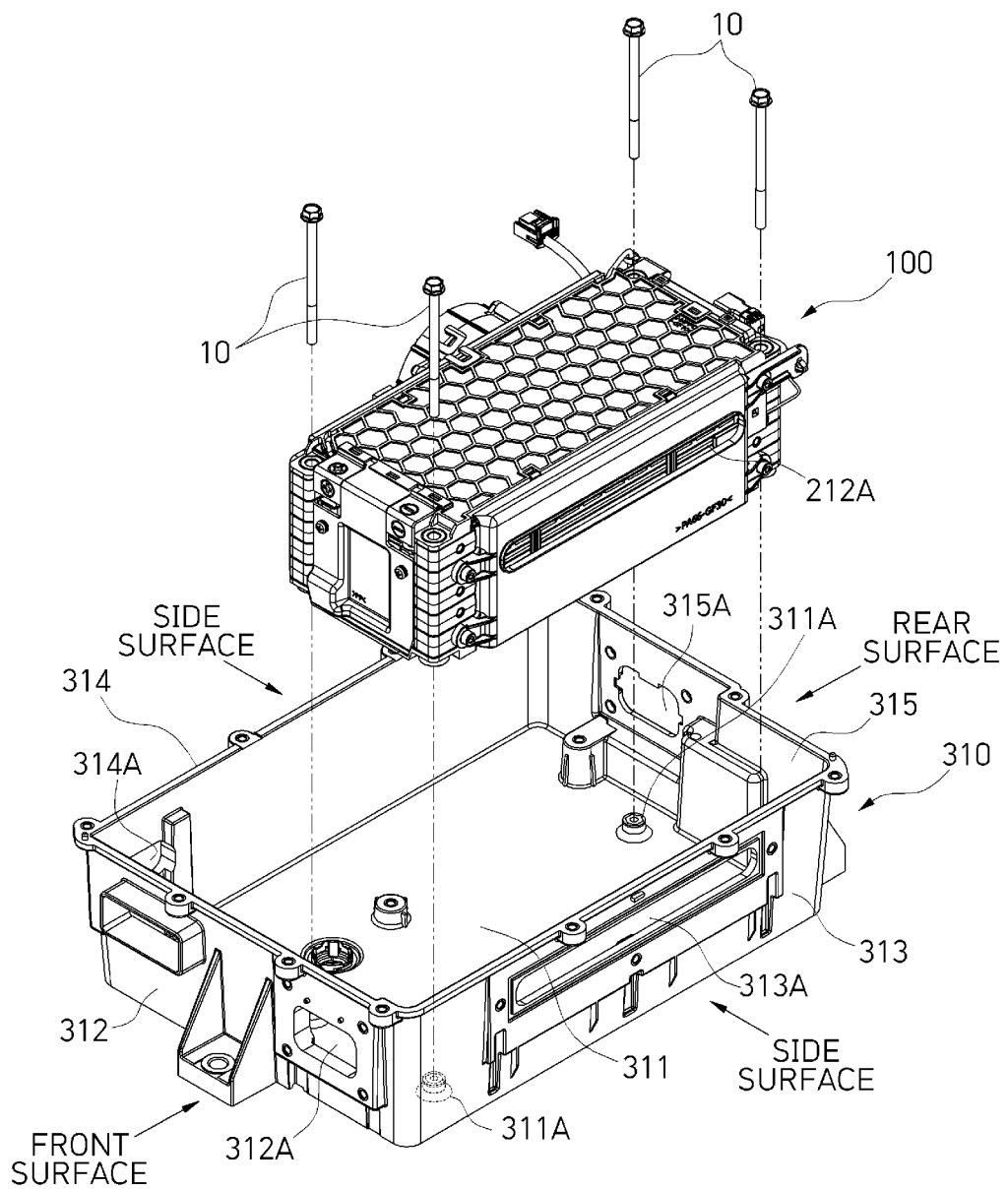
Figure 17:
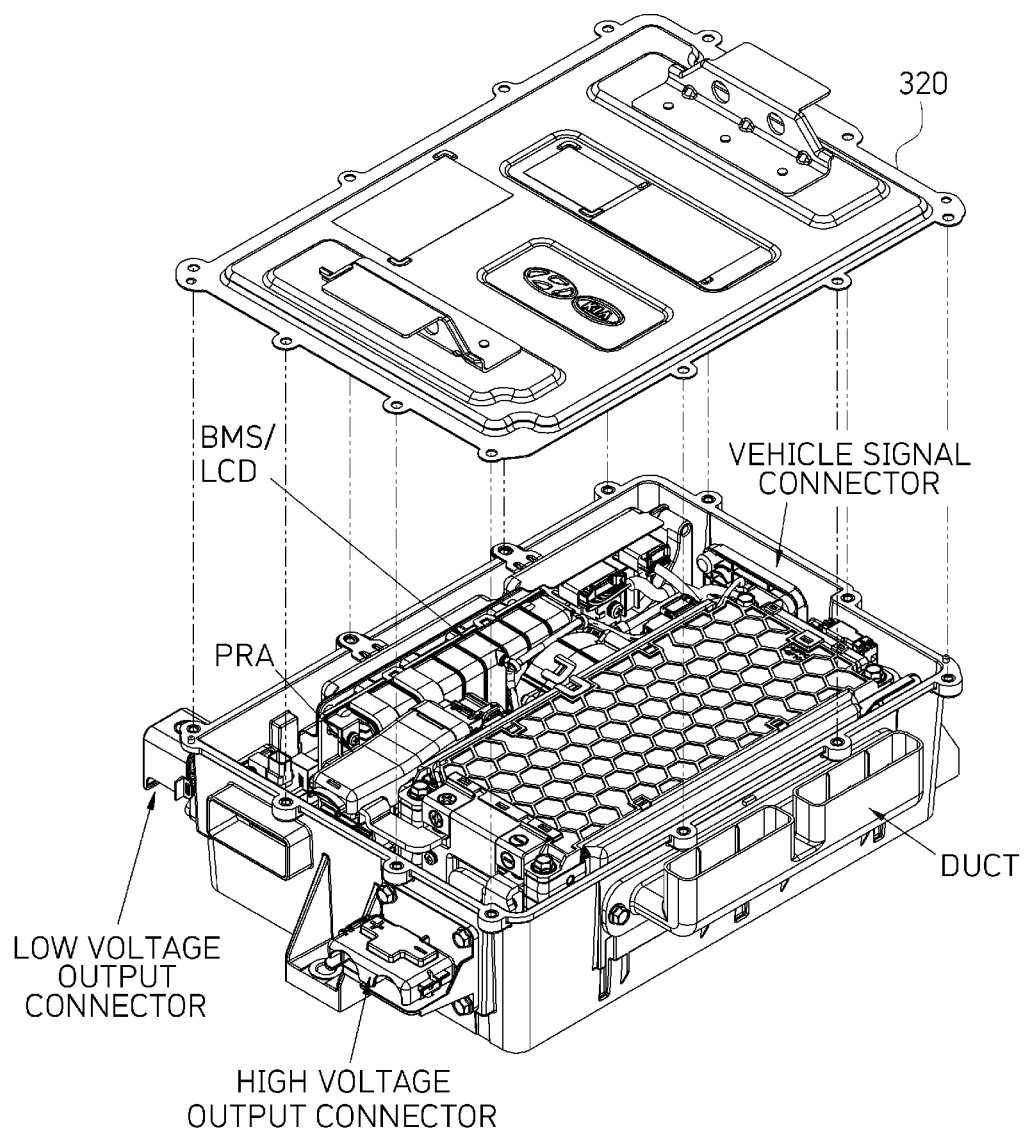

FIGS. 15 to 17 are diagrams for describing a structure where a battery module assembly according to an embodiment of the present invention is mounted on a case.

When a battery module assembly is completed by assembling a plurality of cartridges with each cell therebetween by using a caulking pipe (170 of FIG. 6) and a coupling member (180 of FIG. 180), an operation of mounting the battery module assembly on a case may be performed.

First, referring to FIG. 5, when an assembly of a battery module assembly 100 is completed by using the caulking pipe (170 of FIG. 6) and the coupling member (180 of FIG. 180), a side cover member 120 covering both side surfaces of the battery module assembly 100 may be assembled.

A plurality of side cover members 210 and 220 may include a first side cover member 210 and a second side cover member 220.

The first side cover member 210 may be coupled to one side surface of the battery module assembly 100 to cover the one side surface of the battery module assembly 100.

The first side cover member 210 may include a rectangular plate 212 which covers one side surface of the battery module assembly 100 and a protrusion portion 214 which protrudes from a short side of the plate 212. The protrusion portion 214 may include a fastening hole through which a fastening part 216 passes.

The fastening part 216 may pass through the fastening hole of the protrusion portion 214 and may be fastened to a fastening hole (141B of FIGS. 14 and 15) provided in a side surface of a corner portion 141 of a cartridge B 140 to fasten the first side cover member 210 to one side surface of the battery module assembly 100.

The fastening part 216 may be, for example, a bolt member. A fastening method may be a bolt coupling method.

The plate 212 may include a rectangular hole 212A which is long provided along a long side of the plate 212, and the rectangular hole 212A may act as a path through which air flows.

That is, the rectangular hole 212A may act as a path of air flowing in through an air inflow port (132 of FIG. 12) of a stacked cartridge A 130 and an air inflow port (152 of FIG. 13) of a cartridge C 150, and in terms of acting as a path of air, the first side cover member 210 may act as a duct of the battery module assembly.

The second side cover member 220 may be coupled to the other side surface of the battery module assembly 100 to cover the other side surface of the battery module assembly 100.

The second side cover member 220 may include a rectangular plate 222 which covers the other side surface of the battery module assembly 100 and a cooling fan 224 provided on the plate 222.

The plate 222 may include a discharge port which discharges air to the outside on the basis of an operation of the cooling fan 224, for cooling heat of the battery module assembly 100, and the cooling fan may be mounted on an outer surface of the plate 222 to cover the discharge port.

The plate 222 may include a fastening hole through which the fastening part 226 passes, so as to be coupled to the other side surface of the battery module assembly 100.

The fastening hole may be provided near a corner of the plate 222. The fastening part 226 may pass through the fastening hole provided near the corner of the plate 222 and may be fastened to the fastening hole (141B of FIGS. 14 and 15) provided in the side surface of the corner portion 141 of a cartridge B 140 to fasten the second side cover member 220 to the other side surface of the battery module assembly 100.

When the side cover member is fastened to both side surfaces of the battery module assembly 100, an operation of accommodating (fixing or mounting) the battery module assembly 100, fastened to the side cover member at both side surfaces thereof, into a case may be performed.

In detail, referring to FIGS. 16 and 17, the case with the battery module assembly 100 mounted (accommodated) thereon may include a lower case 310 and an upper case (320 of FIG. 17).

The lower case 310, as illustrated in FIG. 16, may include a bottom member 311 which is approximately rectangular in shape and four sidewall members (for example, first to fourth sidewall members) 312 to 315 which extend from a border of the bottom member 311 in an approximately vertical direction. An accommodating space, where the battery module assembly 100 fastened to the side cover members 212 and 222 is mounted (accommodated), may be provided based on the elements 311 to 315.

A plurality of protrusion portions 311A protruding in an upward direction may be provided in the bottom member 311, and each of the protrusion portions 311A may include a fastening hole fastened to an end portion of a long bolt 10.

The long bolt 10 may pass through a caulking pipe (170 of FIG. 6) provided at a corner of the battery module assembly 100, and an end portion of the long bolt 10 protruding in a downward direction with respect to the battery module assembly 100 may be fastened to a fastening hole of the protrusion portion 311A, whereby the battery module assembly 100 may be accommodated into an internal space of the lower case 310 and may be fixed not to move.

The first sidewall member 312 may be an element which configures a front surface of the case, and a hole 312A, which connects a high voltage output connector to a wire for transferring a high voltage (or a high voltage converted from a voltage output from the battery module assembly 100) output from the battery module assembly 100, may be provided in the first sidewall member 312.

The second sidewall member 313 may be an element which configures one side surface of the case and may include a long-direction hole 313A communicating with a long-direction hole 212A provided in a side cover member (212 of FIG. 15) fastened to a side surface of the battery module assembly 100.

The third sidewall member 314 may be an element which configures the other side surface of the case and may include a hole 312A which connects a low voltage output connector to a wire for transferring a low voltage (or a low voltage converted from a voltage output from the battery module assembly 100) output from the battery module assembly 100.

The fourth sidewall member 315 may be an element which configures a rear surface of the case and may include a hole 315A which connects a vehicle signal connector to a wire for transferring a vehicle signal input/output to/from the battery module assembly 100.

When accommodating of the battery module assembly 100 into an inner portion of the lower case 310 is completed, as illustrated in FIG. 17, electronic parts (for example, a BMS, an LDC, a part for outputting a low voltage, a part for outputting a high voltage, and a part for transmitting and receiving a vehicle signal) may be accommodated into a spare space other than a space, occupied by the battery module assembly 100, of an internal space of the lower case 310, and then, the upper case 320 may be coupled to the lower case 310.

Subsequently, the high voltage output connector, the low voltage output connector, the vehicle signal connector, and the duct may be respectively fastened to the holes provided in the sidewall members of the lower case by using a bolt fastening method, thereby completing an operation of mounting the battery module assembly on the case.

As described above, according to the embodiments of the present invention, the battery module assembly may be assembled with a plurality of stacked cartridges by using a caulking pipe, and the battery module assembly may be mounted on the case by using a fastening member (for example, a long bolt) passing through an internal hole of the caulking pipe.

Therefore, an assembly operation and a mounting operation each performed on the battery module assembly may be integrated by the caulking pipe, and thus, a total volume, the number of parts, and a battery module assembly cycle time may be largely reduced.

Hereinafter, a voltage sensing assembly and a temperature sensing assembly applied to a battery module assembly 100 according to an embodiment of the present invention will be described in detail.

Figure 26:
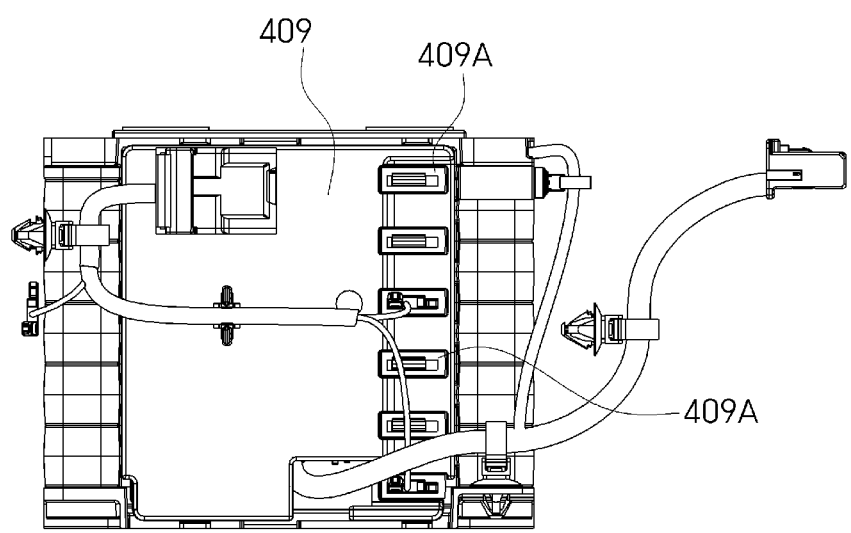
Figure 27:
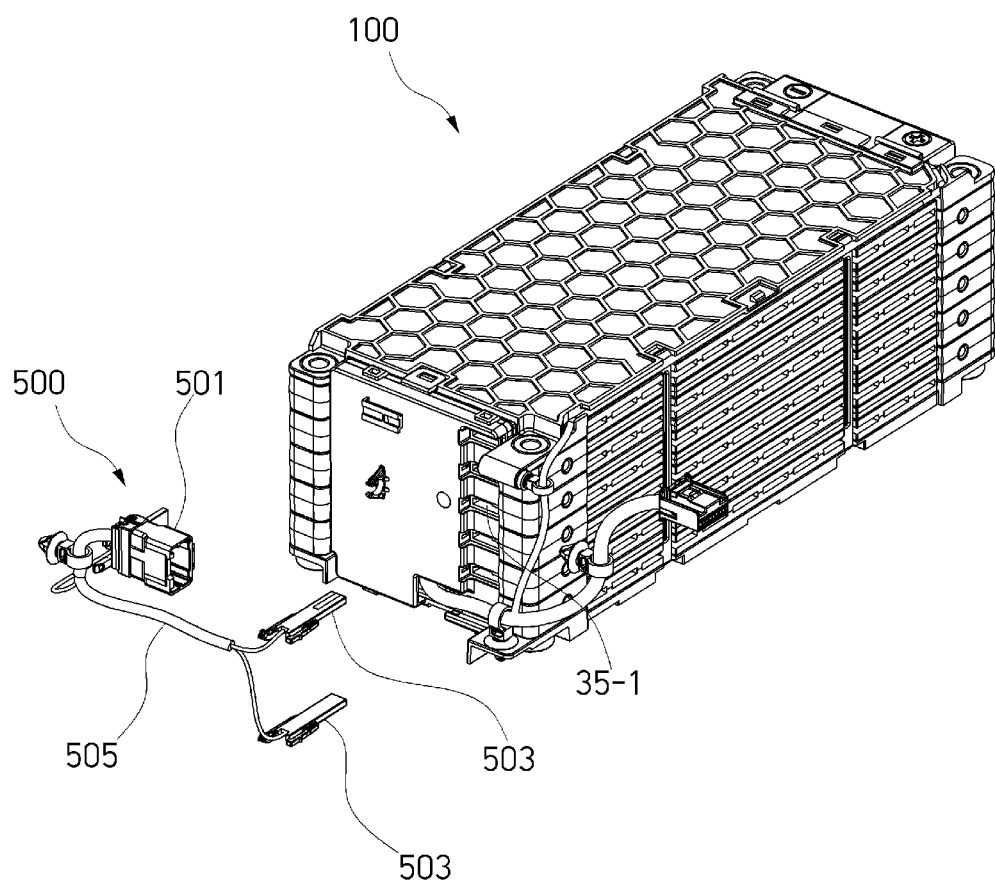
Figure 28:
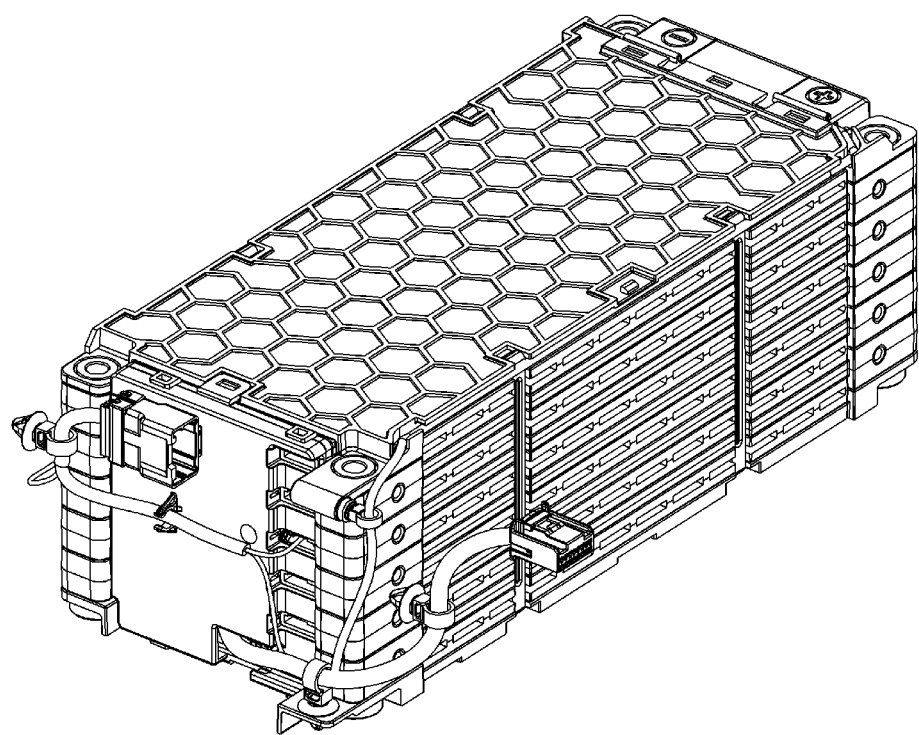
FIG. 28 is a diagram illustrating a final assembly state of a battery module assembly to which a temperature sensing wiring member and a voltage sensing assembly according to an embodiment of the present invention are applied.

FIGS. 18 to 27 are diagrams for describing a temperature sensing wiring and a voltage sensing assembly applied to a battery module assembly 100 according to an embodiment of the present invention, and FIG. 28 is a perspective view of a finished battery module assembly to which a temperature sensing wiring and a voltage sensing assembly according to an embodiment of the present invention are assembled.

The voltage sensing assembly according to an embodiment of the present invention may be implemented as one body with the battery module assembly 100, instead of an independent (split) assembly. Here, the battery module assembly 100 and the voltage sensing assembly being implemented as one body may denote that some elements configuring the voltage sensing assembly are included the battery module assembly 100. For example, a bus bar for voltage sensing and a wire for voltage sensing among elements configuring the voltage sensing assembly may be respectively embedded into some cartridges configuring the battery module assembly 100.

In detail, as illustrated in FIGS. 18 to 26, a voltage sensing assembly 400 according to an embodiment of the present invention may include a bus bar 401 for sensing a voltage, a sensing wire 403 for sensing a voltage, a voltage sensing lower housing 405, a voltage sensing wiring member 407, and a voltage sensing upper housing 409.

Bus Bar 401

Figure 18:
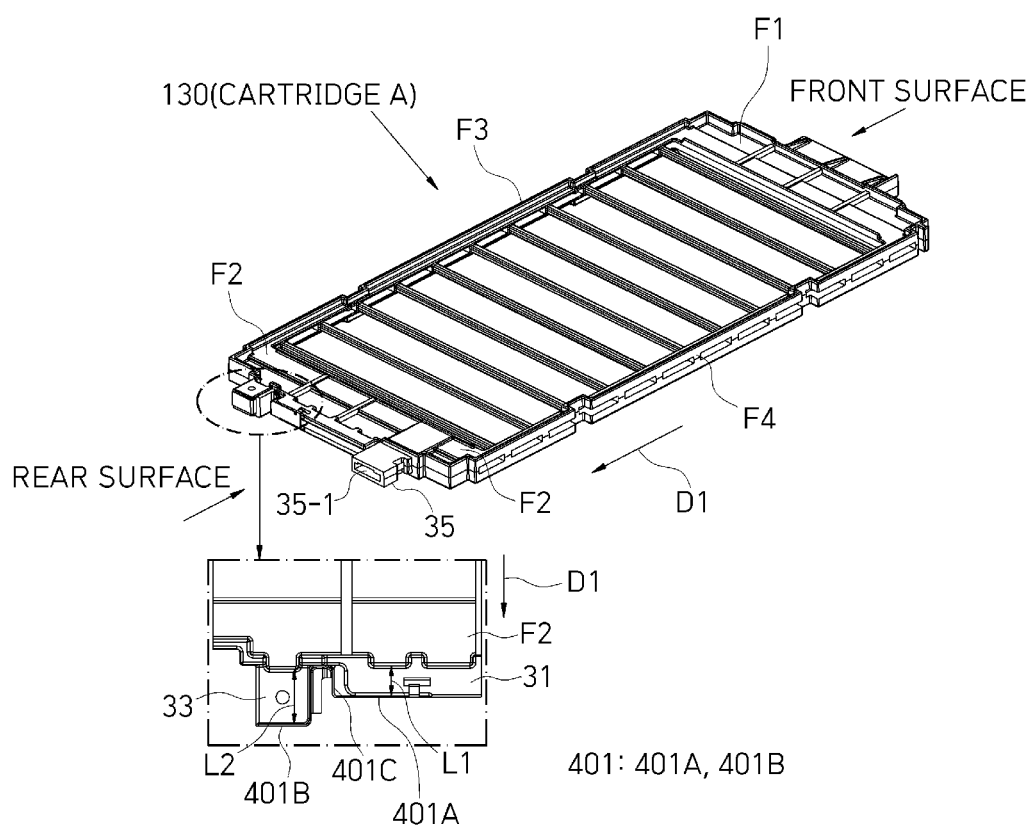
FIGS. 18 to 27 are diagrams for describing a temperature sensing wiring member and a voltage sensing assembly applied to a battery module assembly according to an embodiment of the present invention.

Referring to FIG. 18, the bus bar 401 may be included in a cartridge A 130, and for example, may be disposed on a second frame F2 (or a rear frame) configuring a short side of the cartridge A 130.

The bus bar 401 disposed on the second frame F2 may include a first bus bar 401A, a second bus bar 401B, and a connection part 401C which electrically connects the first bus bar 401A to the second bus bar 401B. The first and second bus bars 401A and 401B and the connection part 401C may be implemented as one body including the same material.

The first bus bar 401A may be on a first protrusion portion 31 of the second frame F2 (or a rear frame). The first protrusion portion 31 may protrude in a long-side lengthwise direction of the cartridge A 130.

The second bus bar 401B may be on a second protrusion portion 33 of the second frame F2 (or the rear frame). The second protrusion portion 33 may protrude in the same direction as a protrusion direction of the first protrusion portion 31 from the second frame F2 (or the rear frame). In this case, a protrusion length L2 of the second protrusion portion 33 may be longer than a protrusion length L1 of the first protrusion portion 31. The reason that the protrusion length L2 of the second protrusion portion 33 is longer than the protrusion length L1 of the first protrusion portion 31 is for connecting the second bus bar 401B, disposed on the second protrusion portion 33, to a sensing terminal 405A included in the below-described voltage sensing lower housing 405.

The connection part 401C may have a shape bent along a curve which is formed between the first protrusion portion 31 and the second protrusion portion 33 as the first protrusion portion 31 and the second protrusion portion 33 protrudes from the second frame F2. A bent shape may be, for example, a ⊏-shape.

Figure 19:
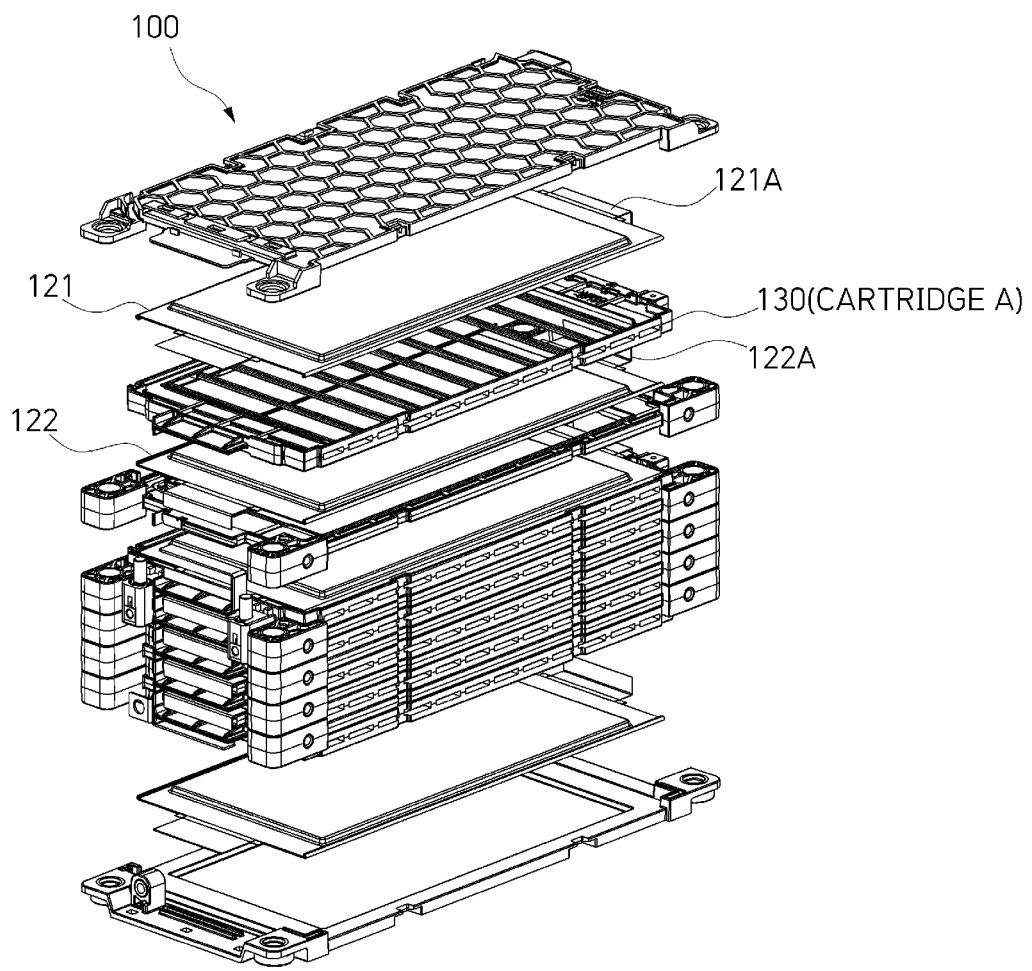

The first bus bar 401A may be electrically connected to, through a surface contact, a cell lead terminal 122A of a cell 122 disposed under the cartridge A 130 illustrated in FIG. 19. In this case, one end portion of the cell lead terminal 122A may have a shape (a ⊓-shape) which is bent in a direction vertical to a cell plane, and based on such a shape, a surface contact may be formed between the one end portion of the cell lead terminal 122A and the first bus bar 401A.

In a state where the first bus part 401A is electrically connected to the cell lead terminal 122A of the cell 122, the cell lead terminal 122A of the cell 122 may be electrically connected to, through a surface contact, a cell lead terminal 121A of a cell 121 disposed on the cartridge A 130. In this case, one end portion of the cell lead terminal 121A of the cell 121 may have a shape (a ⊓-shape) which is bent in a direction (a downward direction) vertical to a cell plane, and based on such a shape, a surface contact may be formed between the one end portion of the cell lead terminal 121A and the one end portion of the cell lead terminal 122A. As a result, all of the first bus bar (401A of FIG. 18), the cell lead terminal (121A of FIG. 19) of the cell 121, and the cell lead terminal (122A of FIG. 19) of the cell 122 may be electrically connected to one another.

Figure 25:
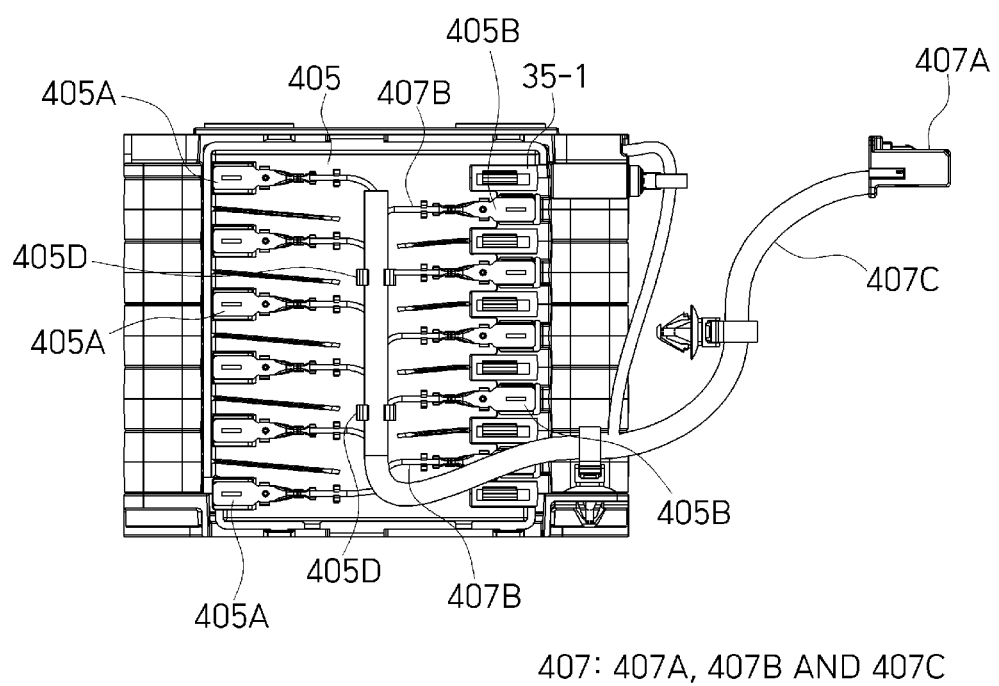

The second bus bar (401B of FIG. 18) may be electrically connected to a voltage sensing terminal 405A provided on the voltage sensing lower housing 405 illustrated in FIG. 25. In this case, for an electrical connection between the second bus bar 401B and the voltage sensing terminal 405A, the second bus bar 401B and the voltage sensing terminal 405A may be connected to each other through laser welding.

Referring again to FIG. 18, the second frame F2 of the cartridge A 130 may further include a third protrusion portion 35, in addition to the first and second protrusion portions 31 and 33. The third protrusion portion 35 may include a hole 35-1 into which a temperature sensor for measuring an internal temperature of the battery module assembly 100 is inserted.

Sensing Wire 403

Figure 20:
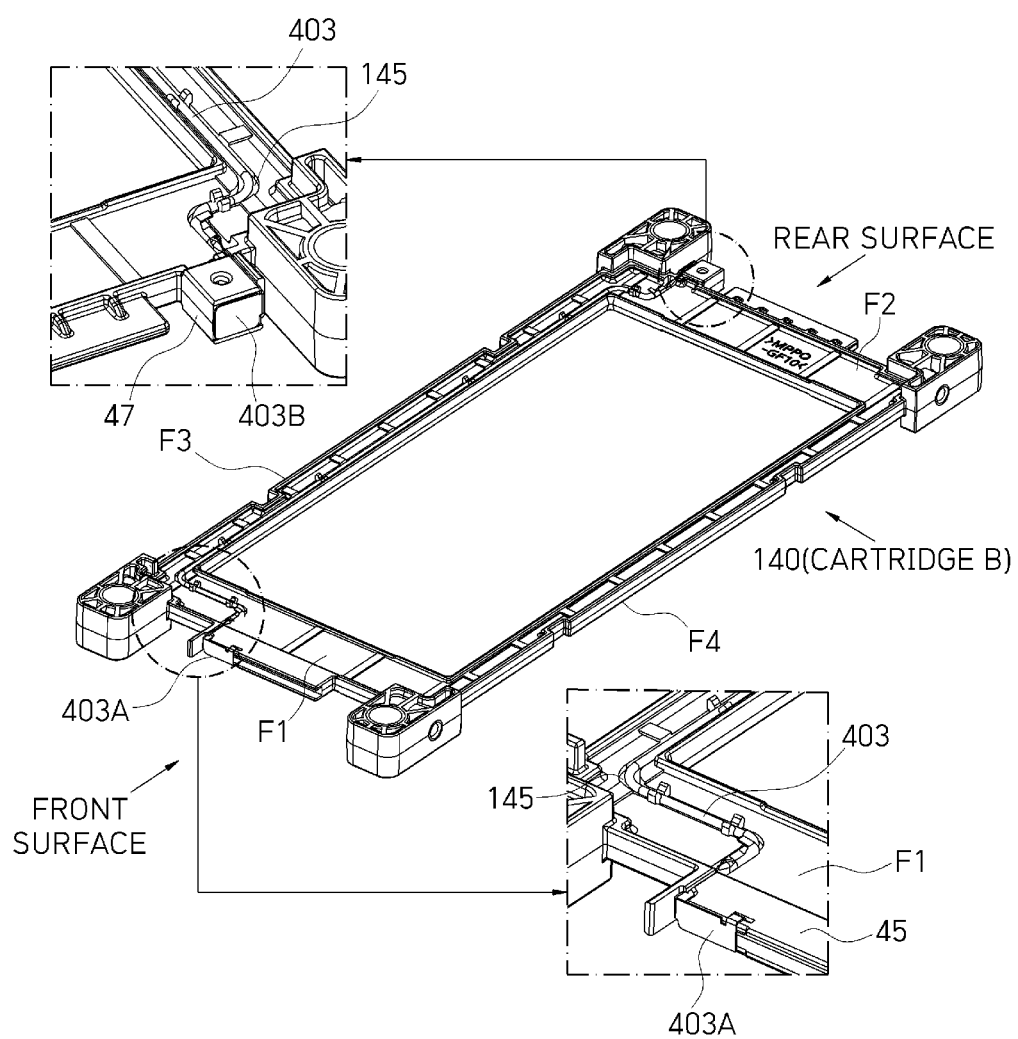

Referring to FIG. 20, a sensing wire 403 may be a wire for voltage sensing and may be included in (buried into) a cartridge B 140.

To this end, the cartridge B 140 may include a groove 145 with the sensing wire 403 buried thereinto. The groove 145 may be formed in the first frame F1 (or a front frame), a third frame F3, and a second frame F2 (or a rear frame). Although not shown, the groove 145 may be formed in the first frame F1 (or the front frame), a fourth frame F4, and a second frame F2 (or the rear frame).

A bus bar may be connected to each of both end portions of the sensing wire 403 included in (buried into) the cartridge B 140.

A bus bar 403A connected to one end portion of the sensing wire 403 may be included in the first frame F1 (or the front frame) of the cartridge B 140, and a bus bar 403B connected to the other end portion of the sensing wire 403 may be included in the second frame F2 (or the rear frame) facing the first frame F1 (or the front frame).

The bus bar 403A included in the first frame F1 (or the front frame) may have a shape which is bent in a ⊓-shape. When the bus bar 403A is divided into one end portion and the other end portion with respect to a bent point, the one end portion may be buried into groove 145 formed in the first frame F1 (or the front frame) and may be electrically connected to the one end portion of the sensing wire 403, and the other end portion may be mounted on the protrusion portion 45 protruding from the first frame F1 (or the front frame) and may be exposed at the outside.

Likewise, the bus bar 403B may have a shape which is bent in a ⊓-shape. When the bus bar 403B is divided into one end portion and the other end portion with respect to a bent point, the one end portion may be buried into a groove 145 formed in the second frame F2 (or the rear frame) and may be electrically connected to the other end portion of the sensing wire 403, and the other end portion of the bus bar 403B may be mounted on the protrusion portion 47 protruding from the second frame F2 and may be exposed at the outside.

Figure 21:
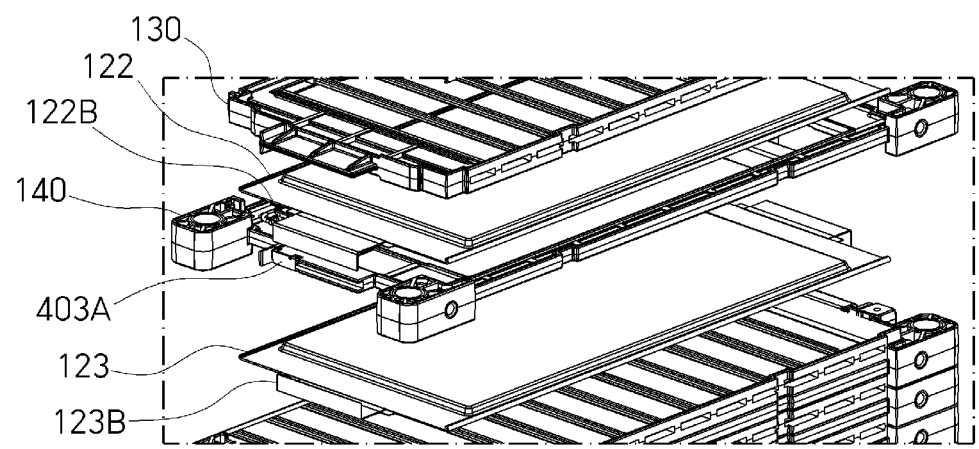

The bus bar 403A mounted on the first frame F1 (or the front frame) of the cartridge B 140, as illustrated in FIG. 21, may be electrically connected to, through a surface contact, a cell lead terminal 122B of a cell 122 disposed on the cartridge B 140 or a cell lead terminal 123B of a cell 123 disposed under the cartridge B 140.

When the bus bar 403A of the cartridge B 140 is electrically connected to, through a surface contact, the cell lead terminal 123B (a terminal bent in a downward direction) of the cell 123 disposed under the cartridge B 140, the cell lead terminal 123B of the cell 123 may be electrically connected to, through a surface contact, the cell lead terminal 122B (a terminal bent in an upward direction) of the cell 122 disposed on the cartridge B 140. As a result, all of the cell lead terminal 122B of the cell 122 and the cell lead terminal 123B of the cell 123 disposed at an upper portion and a lower portion with respect to the cartridge B 140 and the bus bar 403A disposed in the cartridge B 140 may be electrically connected to one another.

In FIGS. 19 and 21, cell lead terminals of cells are illustrated in different colors. The illustrations based on different colors are for showing that materials of cell lead terminals differ. For example, a cell lead terminal (122B of FIG. 21) illustrated in red may include aluminum (Al), and a cell lead terminal (122A of FIG. 19) illustrated in blue may include copper (Cu).

Figure 22A:
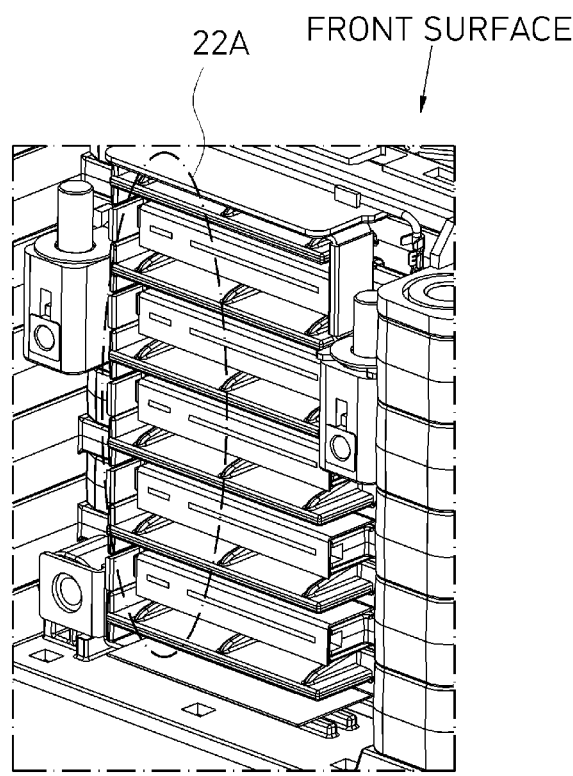
Figure 22B:
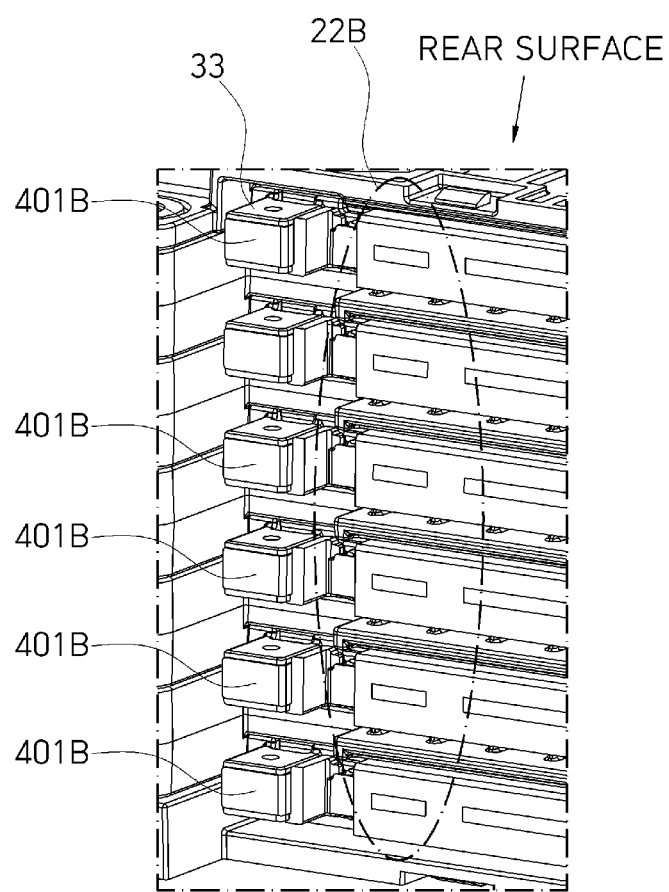

FIG. 22A illustrates a surface contact portion 22A between the bus bar (403A of FIG. 20) of the cartridge B 140 and a cell lead terminal (Al+Cu) when seen with respect to a front surface of an assembly where cartridges are stacked, and FIG. 22B illustrates a surface contact portion 22B between the bus bar (401A of FIG. 20) of the cartridge A 140 and the cell lead terminal (Al+Cu) when seen with respect to a rear surface of an assembly where cartridges are stacked.

Voltage Sensing Lower Housing 405

Figure 23:
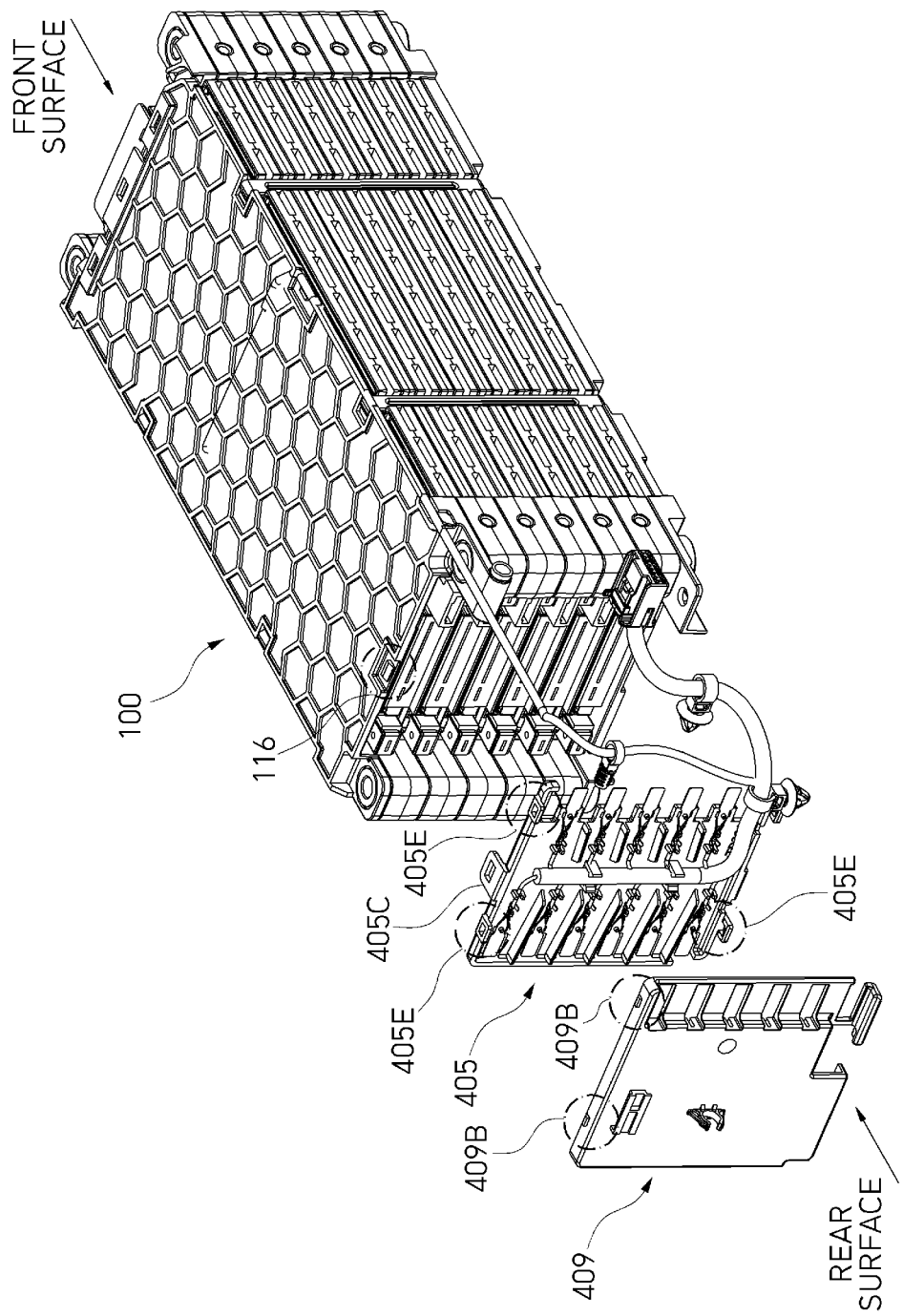
Figure 24:
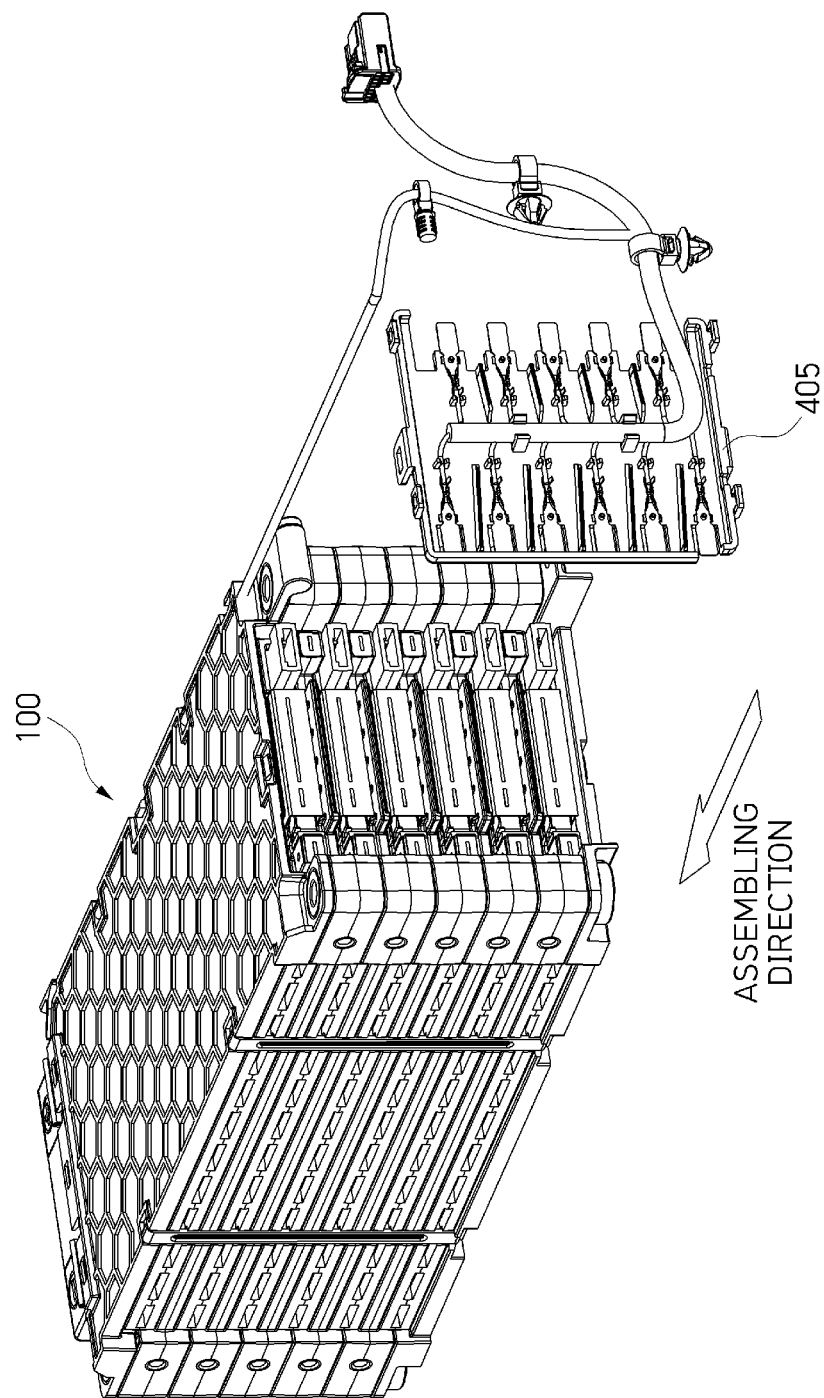

Referring to FIGS. 23 to 25, a voltage sensing lower housing 405 may cover a rear surface (FIG. 22B) of an assembly 100 where a plurality of cartridges are stacked.

A plurality of sensing terminals 405A and 405B arranged in a lengthwise direction (or a vertical direction) may be included in the voltage sensing lower housing 405.

The plurality of sensing terminals 405A and 405B may include a plurality of left sensing terminals 405A arranged in a left lengthwise direction and a plurality of right sensing terminals 405B arranged in a right lengthwise direction, when seen with respect to a front surface of the voltage sensing lower housing 405.

The left sensing terminals 405A may be welded to, by laser welding, a bus bar (401B of FIG. 18) of each of cartridges A among a plurality of stacked cartridges. The right sensing terminals 405B may be welded to, by laser welding, a bus bar (403B of FIG. 18) of each of cartridges B among a plurality of stacked cartridges.

An opening portion may be formed between the right sensing terminals 405B, and a hole 35-1 included in each of the cartridges A may be externally exposed by the opening portion. Here, the hole 35-1 may be a hole (see FIG. 18) with a temperature sensor inserted thereinto.

The voltage sensing lower housing 405 may block, from the outside, a whole rear surface of the assembly 100 with cartridges stacked therein, except for the hole 35-1 included in each of the cartridges A. Therefore, the voltage sensing lower housing 405 may block the external exposure of a surface contact portion 22B between a cell lead terminal and a bus bar (401A of FIG. 18) of the cartridge B 130 illustrated in FIG. 22B.

The voltage sensing lower housing 405, as illustrated in FIG. 24, may be fastened to a rear surface of the assembly 100 with cartridges stacked therein on the basis of a clip method.

For fastening based on the clip method, as illustrated in FIG. 23, a hanging groove (405C of FIG. 23) may be formed in each of an upper end center portion and a lower end center portion of the voltage sensing lower housing 405, an upper hanging groove (405C of FIG. 23) may be coupled to an upper hanging projection portion 116 formed in a center of a short side of an upper cartridge 110 by using a force insertion method, and a lower hanging groove (not clearly shown) of the voltage sensing lower housing 405 may be coupled to a lower hanging projection portion (168 of FIG. 10) of a lower cartridge 160 by using a force insertion method.

Voltage Sensing Wiring Member 407

A voltage sensing wiring member 407 may be connected to the plurality of sensing terminals 405A and 405B included in the voltage sensing lower housing 405, and as illustrated in FIG. 25, may include a connector 407A, a plurality of lines 407B, and a tube 407C.

The connector 407A may be connected to an in-vehicle electronic device (not shown) for sensing a voltage of each cell.

The plurality of sensing lines 407B may connect a connector 407A to the plurality of sensing terminals 405A and 405B included in the voltage sensing lower housing 405 and may be accommodated into the tube 407C.

A plurality of holes may be formed in a side surface of the tube 407C, and the plurality of lines 407B may be unloaded from the tube 407C through the plurality of holes. The plurality of lines 407B unloaded from the tube 407C may be electrically connected to the plurality of sensing terminals 405A and 405B.

One end portion of the tube 407C may be fixed and installed in the same lengthwise direction as a lengthwise direction, in which the plurality of sensing terminals 405A and 405B are arranged, by a grip member 405D included in the voltage sensing lower housing 405. Therefore, the plurality of lines 407B may be easily connected to the plurality of sensing terminals 405A and 405B without being tangled.

Voltage Sensing Upper Housing 409

Referring to FIGS. 23 and 26, a voltage sensing upper housing 409 may be coupled to the voltage sensing lower housing 405 to cover a front surface of the voltage sensing lower housing 405 in a state where the voltage sensing lower housing 405 is coupled to a rear surface of an assembly 100 with a plurality of cartridges stacked therein. Accordingly, the external exposure of the plurality of sensing terminals 405A and 405B of the voltage sensing lower housing 405 may be blocked.

However, the voltage sensing upper housing 409 may include a plurality of holes (409A of FIG. 26) arranged in a lengthwise direction (a vertical direction), for externally exposing the hole 35-1 included in each of the cartridges A. Therefore, the voltage sensing upper housing 409 may cover a front surface of the voltage sensing lower housing 405 except the hole (35-1 of FIG. 18) with a temperature sensor inserted thereinto.

In order to couple the voltage sensing upper housing 409 to the voltage sensing lower housing 405, as illustrated in FIG. 23, two hanging projection portions (409B of FIG. 23) may be formed at each of an upper end and a lower end of the voltage sensing upper housing 409.

The projection portion 409B of the voltage sensing upper housing 409 may be coupled to each of two hanging projection portions 405E formed in each of the upper end and the lower end of the voltage sensing lower housing 405 by using a forced insertion method.

When the voltage sensing upper housing 409 is completely assembled with a rear surface of an assembly with a plurality of cartridges stacked therein, as illustrated in FIG. 27, the temperature sensing wiring member 500 may be coupled to a hole (35-1 of FIG. 18) externally exposed by a hole (409A of FIG. 26) formed in the voltage sensing upper housing 409.

FIG. 27 is a diagram for describing a temperature sensing wiring member 500 according to an embodiment of the present invention.

Referring to FIG. 27, the temperature sensing wiring member 500 may include a connector 501, a temperature sensor 503, and a wiring 505 connecting the connector 501 to the temperature sensor 503.

The connector 501 may be connected to an in-vehicle external electronic device (not shown) for sensing a temperature of a battery cell. The temperature sensor 503 may be inserted into a hole (35-1 of FIG. 18) externally exposed by a hole 409A formed in the voltage sensing upper housing 409.

FIG. 28 illustrates a finished battery module assembly where the temperature sensing wiring member 500 is completely assembled.

As described above, since a bus bar and a voltage sensing wire are individually provided in a space between cartridges A and B, a separate space may not be needed for a voltage sensing assembly, and the total number of elements may be minimized.

According to the embodiments of the present invention, an assembly structure of the battery module assembly may be provided by using the caulking pipe, thereby reducing a total assembly cycle time of the battery module assembly.

Moreover, without an upper/lower frame member, the battery module assembly may be assembled by using the caulking pipe, thereby solving a problem where a handwork of unfolding the partition wall part of the lower frame member before inserting a cell cover surrounding battery cells into the lower frame member is performed several or tens times due to a bending phenomenon of a partition wall part of the lower frame member in the related art.

Moreover, a surface pressure may be secured by using the caulking pipe and a coupling member without an external member.

Moreover, the assembly structure and a mounting structure of the battery module assembly may be provided by using the caulking pipe, thereby reducing the number of elements and a size of the battery module assembly.

Moreover, since a bus bar and a sensing wire for voltage sensing are individually provided in a space between cartridges A and B, a separate space may not be needed for a voltage sensing assembly, and the total number of elements may be minimized.

In addition, the principles of perspective and an embodiment of the present invention, as well as to enumerate the specific embodiments is intended to include the structural and functional equivalents of these considerations, a detailed description of all is to be understood. In addition, these waters evenly currently known equivalents as well as equivalents will be developed in the future, i.e., to include all the elements to perform the same function, regardless of structure and invention should be understood.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A battery module assembly, comprising:
   a plurality of cells;
   a plurality of cartridges stacked in a vertical direction with a corresponding cell therebetween; and
   a caulking pipe inserted into a through hole provided in a corner of each of the stacked plurality of cartridges, for assembling the plurality of cartridges,
   wherein a bus bar and a sensing wire configuring a voltage sensing assembly are included in each of a first cartridge and a second cartridge among the plurality of cartridges assembled by the caulking pipe, and
   wherein the second cartridge is provided in a tetragonal ring shape including a front frame and a rear frame configuring a short side thereof and two side frames configuring a long side thereof, and the sensing wire is buried into a groove provided in the front frame, the rear frame facing the front frame, and one of the two side frames.

2. The battery module assembly of claim 1, wherein the first cartridge is provided in a rectangular shape which includes a front frame and a rear frame configuring a short side thereof and two side frames configuring a long side thereof, and the bus bar is provided in the rear frame.

3. The battery module assembly of claim 1, wherein:
   the first cartridge is provided in a rectangular shape which includes a front frame and a rear frame configuring a short side thereof and two side frames configuring a long side thereof, and
   the bus bar comprises:
   a first bus bar mounted on a first protrusion portion protruding from the rear frame by a first length;
   a second bus bar mounted on a second protrusion portion protruding from the rear frame by a second length which is longer than the first length; and
   a connection part connecting the first bus bar to the second bus bar.

4. The battery module assembly of claim 3, wherein the first bus bar is electrically connected to, through a surface contact, a cell lead terminal of a cell disposed at an upper portion and a cell lead terminal of a cell disposed at a lower portion with the first cartridge therebeween.

5. The battery module assembly of claim 3, wherein the second bus bar is electrically connected to a sensing terminal included in a voltage sensing lower housing covering a rear surface of the battery module assembly with the plurality of cartridges stacked therein.

6. The battery module assembly of claim 1, wherein:
   the sensing wire comprises a first bus bar and a second bus bar connected to both end portions thereof,
   the first bus bar is provided in the front frame, and
   the second bus bar is provided in the rear frame.

7. The battery module assembly of claim 6, wherein the first bus bar is electrically connected to, through a surface contact, a cell lead terminal of a cell disposed at an upper portion and a cell lead terminal of a cell disposed at a lower portion with the second cartridge therebeween.

8. The battery module assembly of claim 6, wherein the second bus bar is electrically connected to a sensing terminal included in a voltage sensing lower housing covering a rear surface of the battery module assembly with the plurality of cartridges stacked therein.

9. A battery module assembly, comprising:
   a plurality of cells;
   a plurality of cartridges stacked in a vertical direction with a corresponding cell therebetween, the plurality of cartridges including a first cartridge including a bus bar configuring a voltage sensing assembly and a second cartridge including a sensing wire configuring the voltage sensing assembly; and
   a caulking pipe inserted into a through hole provided in a corner of each of the stacked plurality of cartridges,
   wherein the voltage sensing assembly comprises:
   a voltage sensing lower housing covering a rear surface of the battery module assembly with the plurality of cartridges stacked therein; and
   a voltage sensing upper housing covering the voltage sensing lower housing.

10. The battery module assembly of claim 9, wherein the voltage sensing lower housing comprises:
    a first sensing terminal connected to a first bus bar provided in the first cartridge; and
    a second sensing terminal connected to a second bus bar connected to one end portion of a sensing wire provided in the second cartridge.

11. The battery module assembly of claim 10, wherein:
    the voltage sensing assembly further comprises a voltage sensing wiring member fixed to and installed in the voltage sensing lower housing, and
    the voltage sensing wiring member comprises:
    a connector connected to an in-vehicle electronic device for sensing a voltage of each of the plurality of cells; and
    a plurality of lines connecting the connector to the first and second sensing terminals.

12. The battery module assembly of claim 9, wherein:
    the first cartridge comprises:
    a front frame configuring a front surface of the battery module assembly with the plurality of cartridges stacked therein;
    a rear frame configuring a rear surface of the assembly; and
    a plurality of side frames configuring both side surfaces of the assembly, the first cartridge has a rectangular shape where the front frame and the rear frame configure a short side thereof and the side frames configure a long side thereof, and
    the bus bar is provided in the rear frame.

13. The battery module assembly of claim 12, wherein:
the rear surface comprises a hole into which a temperature sensor for measuring a temperature of each of the plurality of cells is inserted, and
the voltage sensing lower housing comprises an opening portion externally exposing the hole.

14. The battery module assembly of claim 13, wherein the voltage sensing upper housing comprises a hole externally exposing the hole at a position corresponding to the opening portion.

15. The battery module assembly of claim 9, wherein:
a hanging groove provided in an upper end of the voltage sensing lower housing is fastened to a hanging projection portion provided at a short side of an upper cartridge stacked on an uppermost end among the plurality of cartridges by using a forced insertion method,
a hanging groove provided in a lower end of the voltage sensing lower housing is fastened to a hanging projection portion provided at a short side of a lower cartridge stacked on a lowermost end among the plurality of cartridges by using a forced insertion method, and
the voltage sensing lower housing is coupled to a rear surface of the battery module assembly with the plurality of cartridges stacked therein.

16. The battery module assembly of claim 9, wherein:
a hanging groove provided in an upper end of the voltage sensing lower housing is fastened to a hanging projection portion provided at an upper end of the voltage sensing upper housing by using a forced insertion method,
a hanging groove provided in a lower end of the voltage sensing lower housing is fastened to a hanging projection portion provided at a lower end of the voltage sensing upper housing by using a forced insertion method, and
the voltage sensing upper housing is coupled to the voltage sensing lower housing to cover a front surface of the voltage sensing lower housing.

17. A battery module assembly, comprising:
a plurality of cells;
a plurality of cartridges including a first cartridge and a second cartridge alternately stacked with a corresponding cell therebetween; and
a caulking pipe inserted into a through hole provided in a corner of each of the stacked plurality of cartridges, for assembling the plurality of cartridges,
wherein:
a bus bar among main elements configuring a voltage sensing assembly is disposed in a frame configuring a short side among four frames configuring the first cartridge, and
a sensing wire among the main elements configuring the voltage sensing assembly is disposed in two frames configuring a short side and one frame configuring a long side among four frames configuring the second cartridge.

18. A battery module assembly, comprising:
a plurality of cells;
a plurality of cartridges stacked in a vertical direction with a corresponding cell therebetween; and
a caulking pipe inserted into a through hole provided in a corner of each of the stacked plurality of cartridges, for assembling the plurality of cartridges,
wherein a bus bar and a sensing wire configuring a voltage sensing assembly are included in each of a first cartridge and a second cartridge among the plurality of cartridges assembled by the caulking pipe,
wherein the first cartridge is provided in a rectangular shape which includes a front frame and a rear frame configuring a short side thereof and two side frames configuring a long side thereof, and
wherein the bus bar comprises:
a first bus bar mounted on a first protrusion portion protruding from the rear frame by a first length;
a second bus bar mounted on a second protrusion portion protruding from the rear frame by a second length which is longer than the first length; and
a connection part connecting the first bus bar to the second bus bar.

* * * * *